(12) United States Patent
Lin et al.

(10) Patent No.: US 12,519,235 B2
(45) Date of Patent: Jan. 6, 2026

(54) ELECTRONIC DEVICE

(71) Applicant: Advanced Semiconductor Engineering, Inc., Kaohsiung (TW)

(72) Inventors: Po-An Lin, Kaohsiung (TW); Guan-Wei Chen, Kaohsiung (TW); Shih-Wen Lu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 505 days.

(21) Appl. No.: 17/985,117

(22) Filed: Nov. 10, 2022

(65) Prior Publication Data

US 2024/0162612 A1    May 16, 2024

(51) Int. Cl.
*H01Q 9/04*    (2006.01)
*H01Q 5/10*    (2015.01)

(52) U.S. Cl.
CPC ............. *H01Q 9/0407* (2013.01); *H01Q 5/10* (2015.01)

(58) Field of Classification Search
CPC ............ H01Q 1/38; H01Q 1/52; H01Q 1/243; H01Q 1/2283; H01Q 5/10; H01Q 9/0407; H01Q 9/0457; H01Q 21/28
See application file for complete search history.

(56) References Cited

U.S. PATENT DOCUMENTS

| | | | | |
|---|---|---|---|---|
| 11,984,959 B2* | 5/2024 | Son | ........................ | H04B 1/005 |
| 2011/0163921 A1* | 7/2011 | Chirila | ................... | H01Q 1/526 |
| | | | | 343/702 |
| 2011/0291909 A1* | 12/2011 | Heckler | ............... | H01Q 9/0457 |
| | | | | 343/846 |
| 2018/0026341 A1* | 1/2018 | Mow | ...................... | H01Q 1/243 |
| | | | | 343/702 |
| 2019/0173167 A1* | 6/2019 | Ariumi | ..................... | H01Q 3/24 |
| 2019/0319369 A1* | 10/2019 | Chiang | .................... | H01Q 7/00 |
| 2021/0066814 A1 | 3/2021 | Kim et al. | | |
| 2021/0199598 A1* | 7/2021 | Dellis | .................... | G01N 27/02 |

* cited by examiner

*Primary Examiner* — Tung X Le
(74) *Attorney, Agent, or Firm* — FOLEY & LARDNER LLP

(57) ABSTRACT

The present disclosure provides an electronic device. The electronic device includes a first transceiving element, a second transceiving element disposed over the first transceiving element, and a radiating structure configured to radiate a first EM wave having a lower frequency and a second EM wave having a higher frequency. The first transceiving element and the second transceiving element are collectively configured to provide a higher gain or bandwidth for the first EM wave than for the second EM wave.

19 Claims, 21 Drawing Sheets

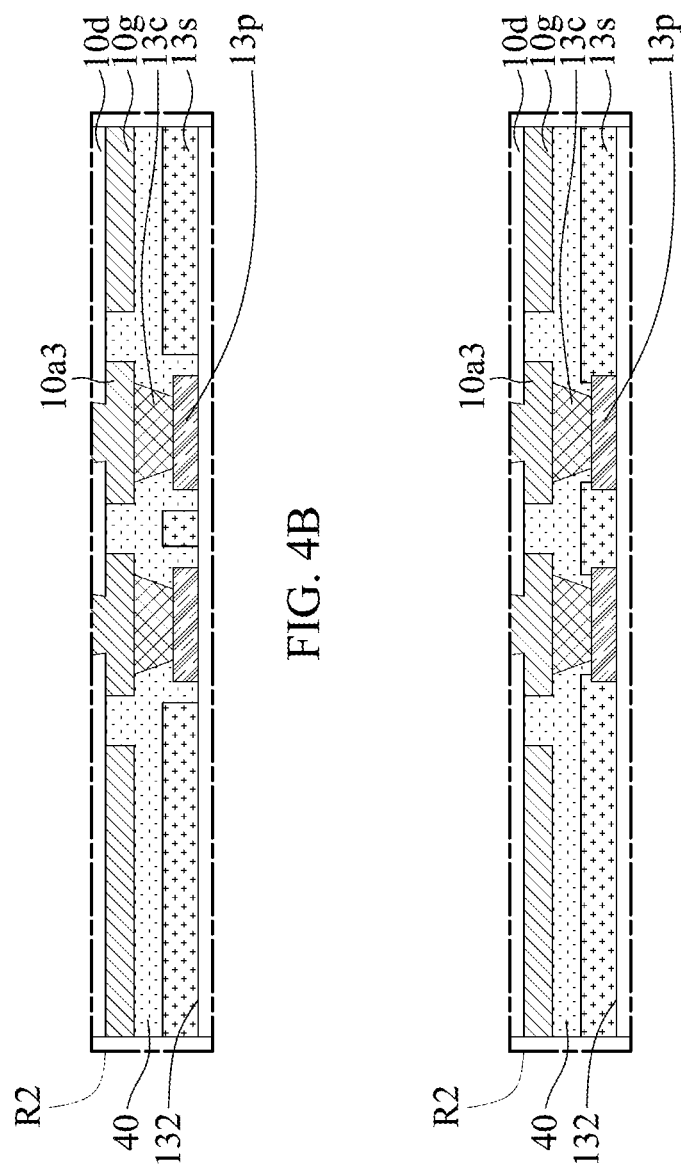

ELECTRONIC DEVICE

BACKGROUND

1. Field of the Disclosure

The present disclosure generally relates to an electronic device.

2. Description of the Related Art

As radio access networks become increasingly ubiquitous, antenna in package (AiP) and antenna on package (AoP) in turn require higher bandwidth capability and better antenna gain in order to support the industry's demand for, e.g., higher data rates, increased functionality, and more users. However, the size and/or form factor of the packages will inevitably be increased.

SUMMARY

In some arrangements, an electronic device includes a first transceiving element, a second transceiving element disposed over the first transceiving element, and a radiating structure configured to radiate a first EM wave having a lower frequency and a second EM wave having a higher frequency. The first transceiving element and the second transceiving element are collectively configured to provide a higher gain or bandwidth for the first EM wave than for the second EM wave.

In some arrangements, an electronic device includes a radiating structure configured to operate at a first frequency and a second frequency different from the first frequency. The electronic device also includes a first transceiving element disposed over the radiating structure and having a first dielectric constant (Dk) and a second transceiving element disposed over the first transceiving element and having a second Dk different from the first Dk. A lateral surface of first transceiving element is substantially aligned with a lateral surface of the radiating structure.

In some arrangements, an electronic device includes an antenna structure including a lateral surface, a first conductive element, and a second conductive element. The second conductive element is electrically coupled to the first conductive element and extends to the lateral surface of the antenna structure. The electronic device also includes a third conductive element disposed at the lateral surface of the antenna structure and configured for connecting the second conductive element to a ground potential.

BRIEF DESCRIPTION OF THE DRAWINGS

Aspects of some arrangements of the present disclosure are best understood from the following detailed description when read with the accompanying figures. It is noted that various structures may not be drawn to scale, and dimensions of the various structures may be arbitrarily increased or reduced for clarity of discussion.

FIG. 4B is an enlarged view of region R1 shown in FIG. 4A, in accordance with an embodiment of the present disclosure.

FIG. 4C is an enlarged view of region R1 shown in FIG. 4A, in accordance with an embodiment of the present disclosure.

DETAILED DESCRIPTION

Figure 1A:
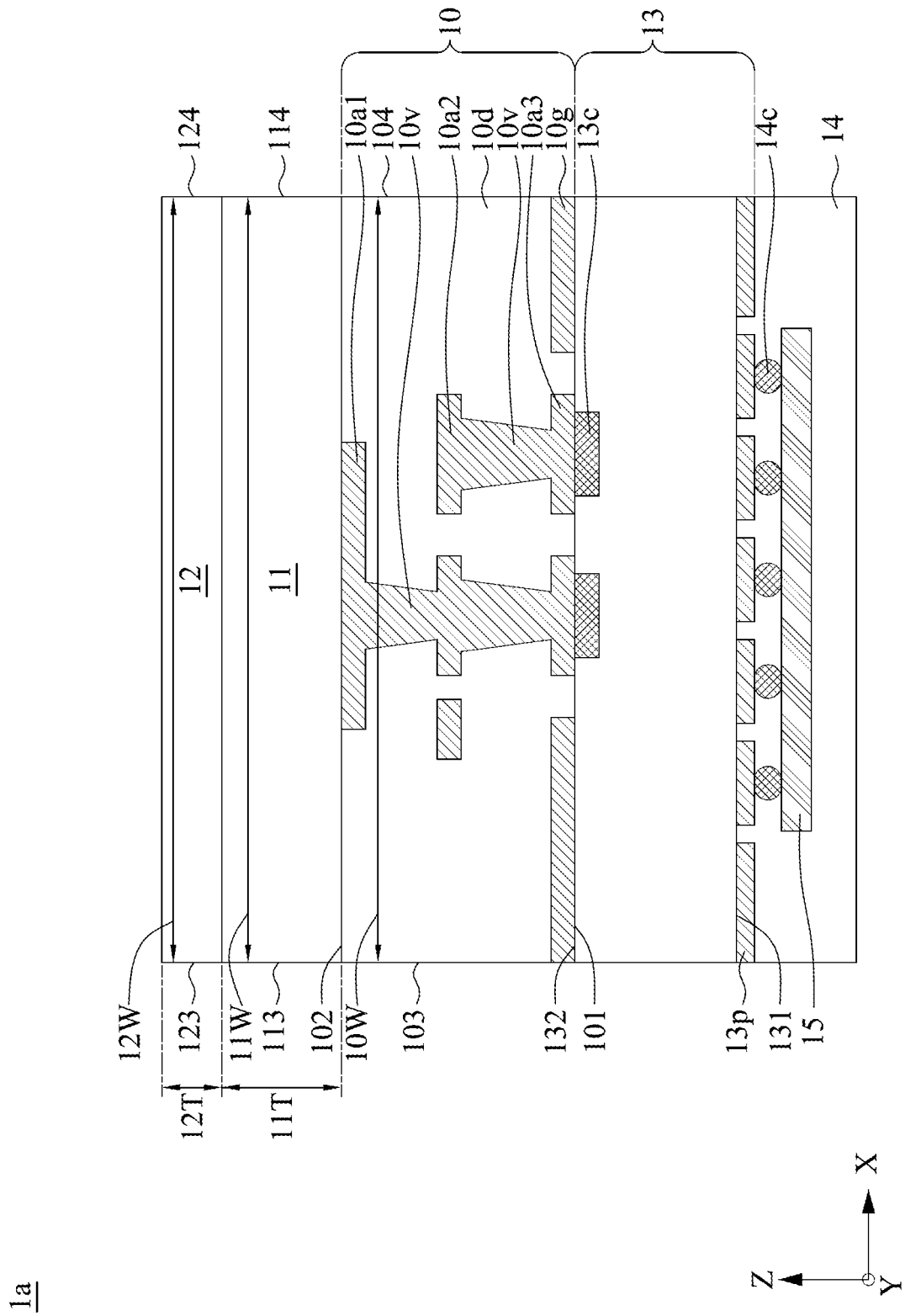
FIG. 1A is a cross-sectional view of an electronic device, in accordance with an embodiment of the present disclosure.

Common reference numerals are used throughout the drawings and the detailed description to indicate the same or similar components. Arrangements of the present disclosure will be readily understood from the following detailed description taken in conjunction with the accompanying drawings.

The following disclosure provides many different arrangements, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include arrangements in which the first and second features are formed or disposed in direct contact, and may also include arrangements in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various arrangements and/or configurations discussed.

FIG. 1A is a cross-sectional view of an electronic device 1a, in accordance with an embodiment of the present disclosure. In some arrangements, the electronic device 1a may be or include, for example, an antenna device or an antenna package. In some arrangements, the electronic device 1a may be or include, for example, a wireless device, such as a user equipment (UE), a mobile station, a mobile device, an apparatus communicating with the Internet of Things (IoT), etc. In some arrangements, the electronic device 1a may be or include a portable device.

The electronic device 1a may include a radiating structure 10, transceiving elements 11, 12, a circuit structure 13, an encapsulant 14, and an electronic component 15.

The radiating structure 10 may be configured to radiate and/or receive electromagnetic (EM) waves/signals, such as radio waves, microwaves, infrared waves, X-rays, gamma rays, etc. The radiating structure 10 may also be referred to as an antenna structure. The radiating structure 10 may be configured to operate at any desirable frequencies (frequency bands and/or bandwidths) to support fifth generation (5G) communications, beyond-5G communications and/or 6G communications. For example, the radiating structure 10 may be configured to operate at microwave frequency bands, Sub-6 GHz frequency bands, 5 GHz frequency bands, terahertz (THz) frequency bands, etc.

The radiating structure 10 may be capable of operating at multiple frequencies (frequency bands and/or bandwidths). For example, the radiating structure 10 may be configured to operate at a relatively higher frequency (a relatively higher frequency band and/or bandwidth) and a relatively lower frequency (a relatively lower frequency band and/or bandwidth). For example, the radiating structure 10 may be configured to radiate and/or receive an EM wave having a relatively higher frequency and an EM wave having a relatively lower frequency. In some arrangements, the radiating structure 10 may be capable of radiating and/or receiving an EM wave having a relatively higher frequency and an EM wave having a relatively lower frequency in parallel.

The radiating structure 10 may include a surface 101, a surface 102 opposite to the surface 101, and lateral surfaces (or sidewalls) 103, 104 extending between the surfaces 101 and 102. The surface 101 and/or the surface 102 of the radiating structure 10 may be parallel to the xy-plane. The radiating structure 10 may include antenna layers 10a1, 10a2, 10a3, one or more grounding portions 10g, one or more dielectric layers 10d, and one or more conductive vias 10v.

The antenna layers 10a1, 10a2, and 10a3 may be overlapped with one another. The antenna layers 10a1, 10a2, and 10a3 may be located at different horizontal levels and spaced apart from one another by a distance. The antenna layer 10a1 may be adjacent to the surface 102 of the radiating structure 10. The antenna layer 10a1 may be coupled to the antenna layer 10a2 through the conductive vias 10v. The antenna layer 10a2 may be coupled to the antenna layer 10a3 through the conductive vias 10v. The antenna layer 10a3 may be adjacent to the surface 101 of the radiating structure 10. The antenna layer 10a3 may include one or more feeding portions. In some arrangements, the antenna layer 10a3 and the grounding portion 10g may be located at the same horizontal level. In some arrangements, the antenna layer 10a3 and the grounding portion 10g may be parts of a patterned conductive layer. As used herein, the term "couple" is used to describe bringing two electric circuits into such close proximity as to permit mutual influence, inductive coupling, energy coupling, etc.

Although there are three antenna layers in FIG. 1A, the number of antenna layers is not limited thereto. In some arrangements, there may be any number of antenna layers depending on design requirements.

The antenna layers 10a1, 10a2, and 10a3 may each be partially or fully within (or covered by) the dielectric layers 10d. In some arrangements, an upper surface (not annotated in the figures) of the antenna layer 10a1 may be exposed by the dielectric layers 10d and exposed on the surface 102 of the radiating structure 10. In some arrangements, a lower surface (not annotated in the figures) of the antenna layer 10a3 may be exposed by the dielectric layers 10d and exposed on the surface 101 of the radiating structure 10.

The antenna layers 10a1, 10a2, and 10a3 may each include an antenna array or an antenna pattern. For example, the antenna layers 10a1, 10a2, and 10a3 may each include a plurality of antennas or antenna elements. In some arrangements, the antennas may be of any suitable type, such as patch antennas, slot-coupled antenna, stacked patches, dipoles, monopoles, etc., and may have different orientations and/or polarizations.

In some arrangements, the antenna layers 10a1, 10a2, and 10a3 may each be configured to radiate and/or receive EM waves having different frequencies (frequency bands and/or bandwidths).

For example, the antenna layer 10a1 may have a frequency higher than a frequency of the antenna layer 10a2 such that a relatively higher-band antenna is closer to the transceiving element 11 than a relatively lower-band antenna. For example, the relatively higher-band antenna is disposed between the transceiving element 11 and the relatively lower-band antenna.

For example, the antenna layer 10a2 may have a frequency higher than a frequency of the antenna layer 10a1 such that a relatively lower-band antenna is closer to the transceiving element 11 than a relatively higher-band antenna. For example, the relatively lower-band antenna is disposed between the transceiving element 11 and the relatively higher-band antenna.

Similarly, in some arrangements, the antenna layer 10a1 may have a frequency higher than a frequency of the antenna layer 10a3, or vice versa. The antenna layer 10a2 may have a frequency higher than a frequency of the antenna layer 10a3, or vice versa.

In some arrangements, the antenna layers 10a1, 10a2, and 10a3, and the conductive vias 10v may each include a conductive material such as a metal or metal alloy. Examples of the conductive material may include, but are not limited to, gold (Au), silver (Ag), copper (Cu), platinum (Pt), Palladium (Pd), other metal(s) or alloy(s), or a combination of two or more thereof. In some arrangements, the dielectric layers 10d may include pre-impregnated composite fibers (e.g., pre-preg), ceramic-filled polytetrafluoroethylene (PTFE) composites, Borophosphosilicate Glass (BPSG), silicon oxide, silicon nitride, silicon oxynitride, Undoped Silicate Glass (USG), any combination thereof, or the like. Examples of a pre-preg may include, but are not limited to, a multi-layer structure formed by stacking or laminating a number of pre-impregnated materials/sheets. In some arrangements, a dielectric constant (Dk) of the dielectric layers 10d may range from about 5 to about 10, such as 5, 6, 7, 8, 9, or 10.

The transceiving element 11 may be disposed adjacent to the surface 102 of the radiating structure 10. The transceiving element 11 may be disposed over or on the surface 102 of the radiating structure 10. The transceiving element 11 may contact (such as directly contact) the antennas of the antenna layer 10a1 of the radiating structure 10.

The transceiving element 11 may be sized as per a surface area of the radiating structure 10. For example, a surface area of the transceiving element 11 in the xy-plane may be substantially equal to a surface area of the radiating structure 10 in the xy-plane. For example, a vertical projection, along the Z-axis, of the boundary of the transceiving element 11 on the radiating structure 10 may be aligned with the boundary of the radiating structure 10.

For example, along a direction substantially parallel to the surface 101 and/or the surface 102 of the radiating structure 10, the radiating structure 10 may include a dimension or a width "10W" and the transceiving element 11 may include a dimension or a width "11W." The width 11W may be substantially equal to the width 10W.

For example, the transceiving element 11 may include a lower surface (not annotated in the figures) facing the radiating structure 10, an upper surface (not annotated in the figures) opposite to the lower surface, and lateral surfaces (or sidewalls) 113, 114 extending between the lower surface and the upper surface. The lateral surface 113 of the transceiving element 11 and the lateral surface 103 of the radiating structure 10 may be substantially coplanar or aligned. The lateral surface 114 of the transceiving element 11 and the lateral surface 104 of the radiating structure 10 may be substantially coplanar or aligned.

The transceiving element 11 may cover (such as entirely cover) the antennas of the radiating structure 10. For example, the radiating area (or the total surface area) of the antennas of the radiating structure 10 may be within the boundary of a vertical projection, along the Z-axis, of the transceiving element 11 on the radiating structure 10.

In some arrangements, at least the radiating area (or the total surface area) of the relatively lower-band antennas of the radiating structure 10 may be fully, entirely, or completely covered by the transceiving element 11. For example, the radiating area (or the total surface area) of the antennas of the antenna layer 10a1 may be covered by the transceiving element 11. For example, the radiating area (or the total surface area) of the antennas of the antenna layer 10a2 may be covered by the transceiving element 11. For example, the radiating area (or the total surface area) of the antennas of the antenna layer 10a3 may be covered by the transceiving element 11.

The transceiving element 12 may be disposed adjacent to the upper surface of the transceiving element 11. The transceiving element 12 may be disposed over or on the upper surface of the transceiving element 11. The transceiving element 12 may contact (such as directly contact) the upper surface of the transceiving element 11.

The transceiving element 12 may be sized as per a surface area of the radiating structure 10. For example, a surface area of the transceiving element 12 in the xy-plane may be substantially equal to a surface area of the radiating structure 10 in the xy-plane. For example, a vertical projection, along the Z-axis, of the boundary of the transceiving element 12 on the radiating structure 10 may be aligned with the boundary of the radiating structure 10.

For example, along a direction substantially parallel to the surface 101 and/or the surface 102 of the radiating structure 10, the transceiving element 12 may include a dimension or a width "12W." The width 12W may be substantially equal to the width 10W.

For example, the transceiving element 12 may include a lower surface (not annotated in the figures) facing the radiating structure 10, an upper surface (not annotated in the figures) opposite to the lower surface, and lateral surfaces (or sidewalls) 123, 124 extending between the lower surface and the upper surface. The lateral surface 123 of the transceiving element 12 and the lateral surface 103 of the radiating structure 10 may be substantially coplanar or aligned. The lateral surface 124 of the transceiving element 12 and the lateral surface 104 of the radiating structure 10 may be substantially coplanar or aligned.

The transceiving element 12 may cover (such as entirely cover) the antennas of the radiating structure 10. For example, the radiating area (or the total surface area) of the antennas of the radiating structure 10 may be within the boundary of a vertical projection, along the Z-axis, of the transceiving element 12 on the radiating structure 10.

In some arrangements, at least the radiating area (or the total surface area) of the relatively lower-band antennas of the radiating structure 10 may be fully, entirely, or completely covered by the transceiving element 12. For example, the radiating area (or the total surface area) of the antennas of the antenna layer 10a1 may be covered by the transceiving element 12. For example, the radiating area (or the total surface area) of the antennas of the antenna layer 10a2 may be covered by the transceiving element 12. For example, the radiating area (or the total surface area) of the antennas of the antenna layer 10a3 may be covered by the transceiving element 12.

Although there are two transceiving elements in FIG. 1A, the number of transceiving elements is not limited thereto. In some arrangements, there may be any number of transceiving elements depending on design requirements.

The EM waves radiated by the radiating structure 10 may propagate or transmit through the transceiving element 11 and the transceiving element 12. In some arrangements, the antenna layer 10a1 may include a coupling device for launching and/or receiving/extracting EM waves to and from the transceiving element 11 and the transceiving element 12. Examples of the coupling device may include, but are not limited to, a resonant cavity, a slot, a strip line, a waveguide, etc.

The transceiving element 11 and the transceiving element 12 may also be referred to as focusing elements, dielectric layers, or directing elements. The transceiving element 11 and the transceiving element 12 may be elements configured to focus the EM waves radiated by the radiating structure 10. The transceiving element 11 and the transceiving element 12 may be waveguides configured to guide the EM waves from the radiating structure 10 to the outside of the electronic device 1a, or vice versa. The transceiving element 11 and the transceiving element 12 may be transmission mediums configured to support the propagation of the EM waves from the radiating structure 10 to the outside of the electronic device 1a, or vice versa.

The transceiving element 11 and the transceiving element 12 may include a dielectric resonator. In some arrangements, the EM waves radiated by the radiating structure 10 may be introduced into the inside of the resonator material and bounce back and forth between the resonator walls, forming standing waves. In some arrangements, an EM wave having a relatively higher frequency may resonate in the transceiving element 12. In some arrangements, an EM wave having a relatively lower frequency may resonate in the transceiving element 11 and the transceiving element 12. In some arrangements, the dielectric resonator may be configured to increase antenna gain, to increase bandwidth, and/or to adjust resonant frequency and impedance of the EM waves radiated by the radiating structure 10.

In some arrangements, the EM waves radiated or received by the radiating structure 10 may be completely transmitted through the transceiving element 11 and/or the transceiving element 12. In some arrangements, the EM waves radiated or received by the radiating structure 10 may have an EM field that lies primarily or substantially inside of the transceiving element 11 and/or the transceiving element 12. For example, the EM field strength may be concentrated primarily or substantially inside of the transceiving element 11 and/or the transceiving element 12. The regions outside the transceiving element 11 and/or the transceiving element 12 may have little or no EM field.

The transceiving element 11 and the transceiving element 12 may have different properties (e.g., dielectric properties) or characteristics. The transceiving element 11 and the transceiving element 12 may have different reflection coefficients. The transceiving element 11 and the transceiving element 12 may have different dielectric constants (Dk) and/or different dissipation factors (Df). For example, the transceiving element 11 may include a material having a relatively lower Dk (e.g., between about 2 and about 10) and the transceiving element 12 may include a material having a relatively higher Dk (e.g., between about 10 and about 25).

In some arrangements, the transceiving element 11 and the transceiving element 12 may each include an encapsulant. In some arrangements, the transceiving element 11 and the transceiving element 12 may each include an epoxy resin having fillers, a molding compound (e.g., an epoxy molding compound or other molding compound), a polyimide, a phenolic compound or material, a material with a silicone dispersed therein, or a combination thereof. In some arrangements, the transceiving element 11 and the transceiving element 12 may each include a dielectric material stated above with respect to the dielectric layers 10d.

In some arrangements, the transceiving element 11 and the transceiving element 12 may have different materials. In some arrangements, the transceiving element 11 and the transceiving element 12 may have the same material. In some arrangements, an interface (e.g., a hetero-interface) may be formed between the transceiving element 11 and the transceiving element 12.

In some arrangements, the EM waves radiated or received by the radiating structure 10 may be affected by the presence of one or more interfaces between the different transmission mediums, such as an outer surface (or a boundary) of the transceiving element 11, an outer surface (or a boundary) of the transceiving element 12, and an interface (or another interior portion) between the transceiving element 11 and the transceiving element 12.

The transceiving element 11 may include a dimension or a thickness "11T" measured along a direction substantially perpendicular to the surface 101 and/or the surface 102 of the radiating structure 10. The transceiving element 12 may include a dimension or a thickness "12T" measured along a direction substantially perpendicular to the surface 101 and/or the surface 102 of the radiating structure 10. In some arrangements, the thickness 11T of the transceiving element 11 may be greater than the thickness 12T of the transceiving element 12. In some arrangements, the thickness 12T of the transceiving element 12 may be greater than the thickness 11T of the transceiving element 11.

The circuit structure 13 may be disposed adjacent to the surface 101 of the radiating structure 10. The circuit structure 13 may be disposed over or on the surface 101 of the radiating structure 10. The circuit structure 13 may contact (such as directly contact) the antennas of the antenna layer 10a3 of the radiating structure 10. The radiating structure 10 may be disposed between the circuit structure 13 and the transceiving element 11.

In some arrangements, the circuit structure 13 may be or include, for example, a substrate. In some arrangements, the circuit structure 13 may include, for example, a printed circuit board (PCB), such as a paper-based copper foil laminate, a composite copper foil laminate, or a polymer-impregnated glass-fiber-based copper foil laminate. In some arrangements, the circuit structure 13 may include a dielectric material stated above with respect to the dielectric layers 10d. In some arrangements, a Dk of the dielectric material of the circuit structure 13 may range from about 3 to about 5, such as 3, 3.2, 3.4, 3.6, 3.8, 4, 4.2, 4.4, 4.6, 4.8, or 5.

In some arrangements, the circuit structure 13 may include conductive pad(s), trace(s), via(s), layer(s), other conductive element(s), or other interconnection(s). For example, the circuit structure 13 may include one or more transmission lines (e.g., communications cables) and one or more grounding lines and/or grounding planes. For example, the circuit structure 13 may include one or more conductive pads 13p in proximity to, adjacent to, or embedded in and exposed at a surface 131 and/or a surface 132 of the circuit structure 13. The surface 131 may face away from the radiating structure 10 and the surface 132 may face the radiating structure 10. The circuit structure 13 may include a passivation layer (e.g., a solder resist, such as the passivation layer 13s in FIG. 3B) on the surface 131 and/or the surface 132 to fully expose or to expose at least a portion of the conductive pads 13p for electrical connections.

For example, the circuit structure 13 may include one or more conductive elements 13c. The conductive elements 13c may be disposed between the circuit structure 13 and the antennas (such as the feeding pattern) of the radiating structure 10. The conductive elements 13c may be covered by the dielectric material of the circuit structure 13. In some arrangements, as shown in FIG. 3B, the conductive elements 13c may be disposed over or on the surface 132 and electrically connected with the conductive pads 13p on the surface 132.

In some arrangements, the conductive elements 13c may electrically connect the circuit structure 13 and the antennas (such as the feeding pattern) of the radiating structure 10. In some arrangements, the conductive elements 13c may provide a feed signal to the antennas (such as the feeding pattern) of the radiating structure 10. The conductive elements 13c may include, for example, a conductive paste, a conductive filler, a solder material, a metal or other suitable materials. Examples of the solder material include alloys of gold and tin solder or alloys of silver and tin solder.

The electronic component 15 may be disposed over or on the surface 131 of the circuit structure 13. The electronic component 15 may be electrically connected to one or more other electrical components (if any) and to the circuit structure 13 (e.g., to the interconnection(s)), and the electrical connection may be attained by way of flip-chip, wire-bond techniques, metal to metal bonding (such as Cu to Cu bonding), or hybrid bonding. In some arrangements, the electronic component 15 may be electrically connected to the circuit structure 13 through one or more conductive elements (or electrical contacts) 14c. In some arrangements, the conductive elements 14c may include a controlled collapse chip connection (C4) bump, a ball grid array (BGA) or a land grid array (LGA).

The electronic component 15 may be a chip or a die including a semiconductor substrate, one or more integrated circuit (IC) devices and one or more overlying interconnection structures therein. The IC devices may include active devices such as transistors and/or passive devices such as resistors, capacitors, inductors, or a combination thereof. For example, the electronic component 15 may include a system on chip (SoC). For example, the electronic component 15 may include a radio frequency integrated circuit (RFIC), an application-specific IC (ASIC), a central processing unit (CPU), a microprocessor unit (MPU), a graphics processing unit (GPU), a microcontroller unit (MCU), a field-programmable gate array (FPGA), or another type of IC.

Although there is one electronic component in FIG. 1A, the number of electronic components is not limited thereto. In some arrangements, there may be any number of electronic components depending on design requirements.

The encapsulant 14 may be disposed over or on the surface 131 of the circuit structure 13 to cover the electronic component 15. The encapsulant 14 may include insulation or dielectric material. In some arrangements, the encapsulant 14 may include an epoxy resin having fillers, a molding compound (e.g., an epoxy molding compound or other molding compound), a polyimide, a phenolic compound or material, a material with a silicone dispersed therein, or a combination thereof.

According to some arrangements of the present disclosure, the transceiving element 11 and the transceiving element 12 may be configured to collectively or collaboratively focus the EM waves radiated or received by the radiating structure 10 and concentrate the EM field strength thereof. In some arrangements, the transceiving element 11 and the transceiving element 12 may have progressive (or multi-stage) focusing effect on the EM waves. Therefore, the antenna gain and the antenna directivity may be increased.

Specifically, by using multiple transceiving elements, a variety of factors of the EM waves can be matched (by, for example, adjusting the properties or characteristics of the transceiving elements 11 and 12 and controlling the desired transmission distance) to obtain a desired EM field structure. The factors of the EM waves to be matched may include resonant frequency, impedance, admittance (the reciprocal of impedance), phase, wavelength, etc.

In addition, since the transceiving elements 11 and 12 are sized as per the radiating structure 10 to cover the radiating area (or the total surface area) of radiating structure 10, the radiating structure 10 may have an EM field that lies primarily or substantially inside of the transceiving elements 11 and 12. The relatively higher-band antenna and the relatively lower-band antenna of the radiating structure 10 may both be improved in terms of the antenna gain and the antenna directivity. The radiating structure 10 can operate at multiple frequencies (frequency bands and/or bandwidths) and support high data rates with better coverage range.

Furthermore, since the transceiving elements 11 and 12 and the radiating structure 10 can be formed on a substrate (such as circuit structure 13 or a fan-out substrate 70 in FIG. 7) that includes several carrier units and then singulated or diced into a plurality of individual carrier units in a singulation operation, the manufacturing process can be simplified.

In some arrangements, the impact or effect of the transceiving elements 11 and 12 on the relatively lower-band antenna of the radiating structure 10 (e.g., on an EM wave having a relatively lower frequency) may be greater than that on the relatively higher-band antenna of the radiating structure 10 (e.g., on an EM wave having a relatively higher frequency).

In some arrangements, the transceiving element 11 and the transceiving element 12 may have progressive (or multi-stage) focusing effect on the EM waves. For example, the transceiving elements 11 and 12 may be configured to collectively or collaboratively provide a higher focusing degree (steering degree or aggregating degree) for the relatively lower-band antenna of the radiating structure 10 than for the relatively higher-band antenna of the radiating structure 10. For example, the transceiving elements 11 and 12 may be configured to collectively or collaboratively provide a higher antenna gain for the relatively lower-band antenna of the radiating structure 10 than for the relatively higher-band antenna of the radiating structure 10. For example, the transceiving elements 11 and 12 may be configured to collectively or collaboratively provide a higher bandwidth for the relatively lower-band antenna of the radiating structure 10 than for the relatively higher-band antenna of the radiating structure 10.

For example, the percentage increase in the antenna gain of the relatively lower-band antenna of the radiating structure 10 may be greater than the percentage increase in the antenna gain of the relatively higher-band antenna of the radiating structure 10. For example, the percentage increase in the antenna directivity of the relatively lower-band antenna of the radiating structure 10 may be greater than the percentage increase in the antenna directivity of the relatively higher-band antenna of the radiating structure 10.

In some arrangements, the impact or effect of the transceiving element 11 on the relatively lower-band antenna of the radiating structure 10 (e.g., on an EM wave having a relatively lower frequency) may be greater than that on the relatively higher-band antenna of the radiating structure 10 (e.g., on an EM wave having a relatively higher frequency).

In some arrangements, the impact or effect of the transceiving element 12 on the relatively higher-band antenna of the radiating structure 10 (e.g., on an EM wave having a relatively higher frequency) may be greater than that on the relatively lower-band antenna of the radiating structure 10 (e.g., on an EM wave having a relatively lower frequency).

Figure 1B:
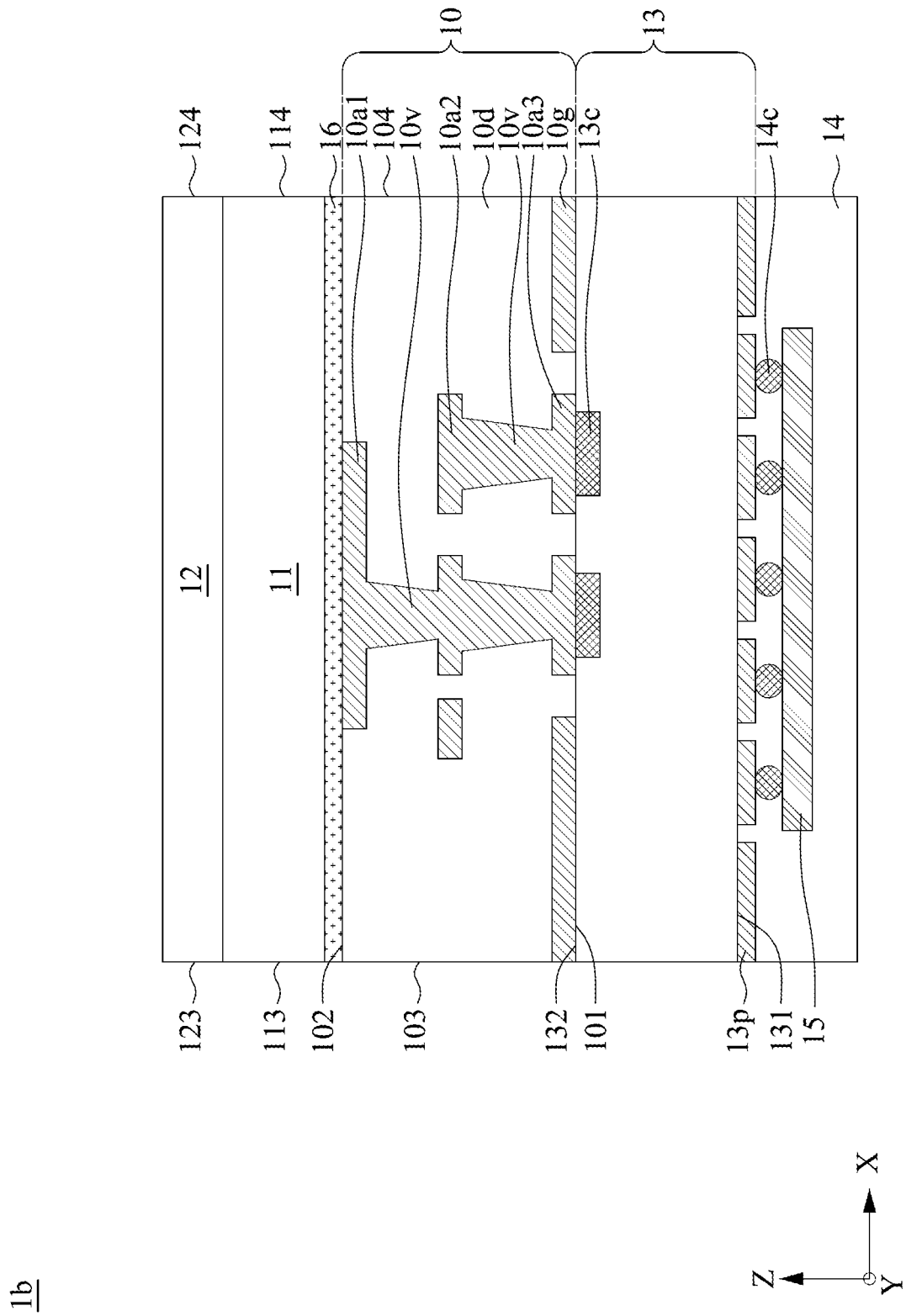
FIG. 1B is a cross-sectional view of an electronic device, in accordance with an embodiment of the present disclosure.

FIG. 1B is a cross-sectional view of an electronic device 1b, in accordance with an embodiment of the present disclosure. The electronic device 1b is similar to the electronic device 1a in FIG. 1A, and the differences therebetween are described below.

The electronic device 1b may further include a layer 16. The layer 16 may be disposed adjacent to the surface 102 of the radiating structure 10. The layer 16 may be disposed over or on the surface 102 of the radiating structure 10. The layer 16 may contact (such as directly contact) the antennas of the antenna layer 10a1 of the radiating structure 10. The layer 16 may physically separate the radiating structure 10 from the transceiving element 11.

In some arrangements, the layer 16 may include a protective layer or a bonding layer. In some arrangements, the layer 16 may include a solder resist layer, an adhesive, a glue, an underfill, or other suitable materials. In some arrangements, the layer 16 may a material having a Dk lower than the Dk of the transceiving element 11 and/or the Dk of the transceiving element 12.

Figure 1C:
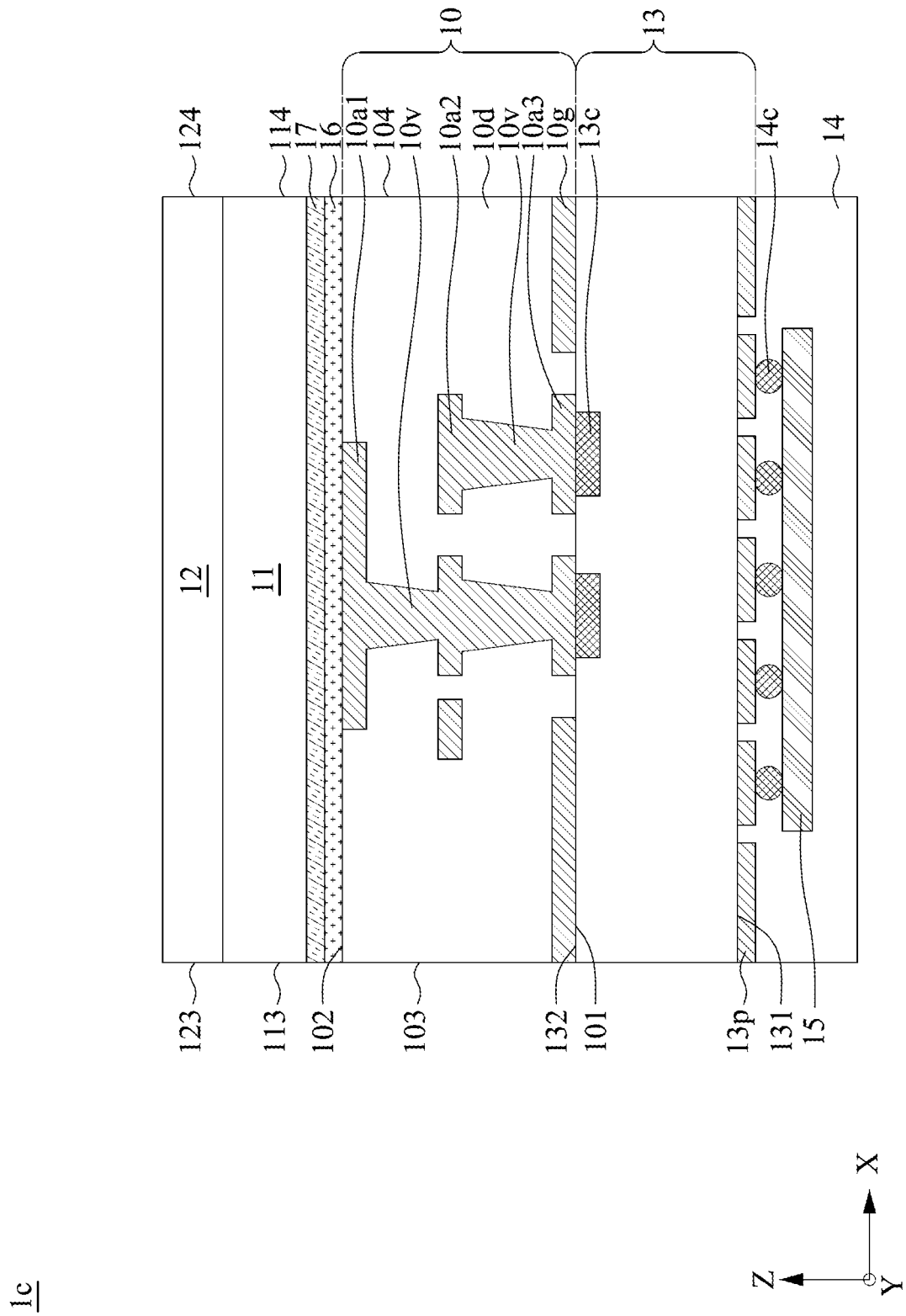
FIG. 1C is a cross-sectional view of an electronic device, in accordance with an embodiment of the present disclosure.

FIG. 1C is a cross-sectional view of an electronic device 1c, in accordance with an embodiment of the present disclosure. The electronic device 1c is similar to the electronic device 1b in FIG. 1B, and the differences therebetween are described below.

The electronic device 1c may further include a layer 17. In some arrangements, the layer 17 may include a protective layer or a bonding layer. In some arrangements, the layer 17 may include a solder resist layer, an adhesive, a glue, an underfill, or other suitable materials. In some arrangements, the layer 17 may a material having a Dk lower than the Dk of the transceiving element 11 and/or the Dk of the transceiving element 12.

In some arrangements, the layer 16 may be configured to protect the antenna layer 10a1 of the radiating structure 10 and the layer 17 may be configured to bond the layer 16 to the transceiving element 11.

Figure 2A:
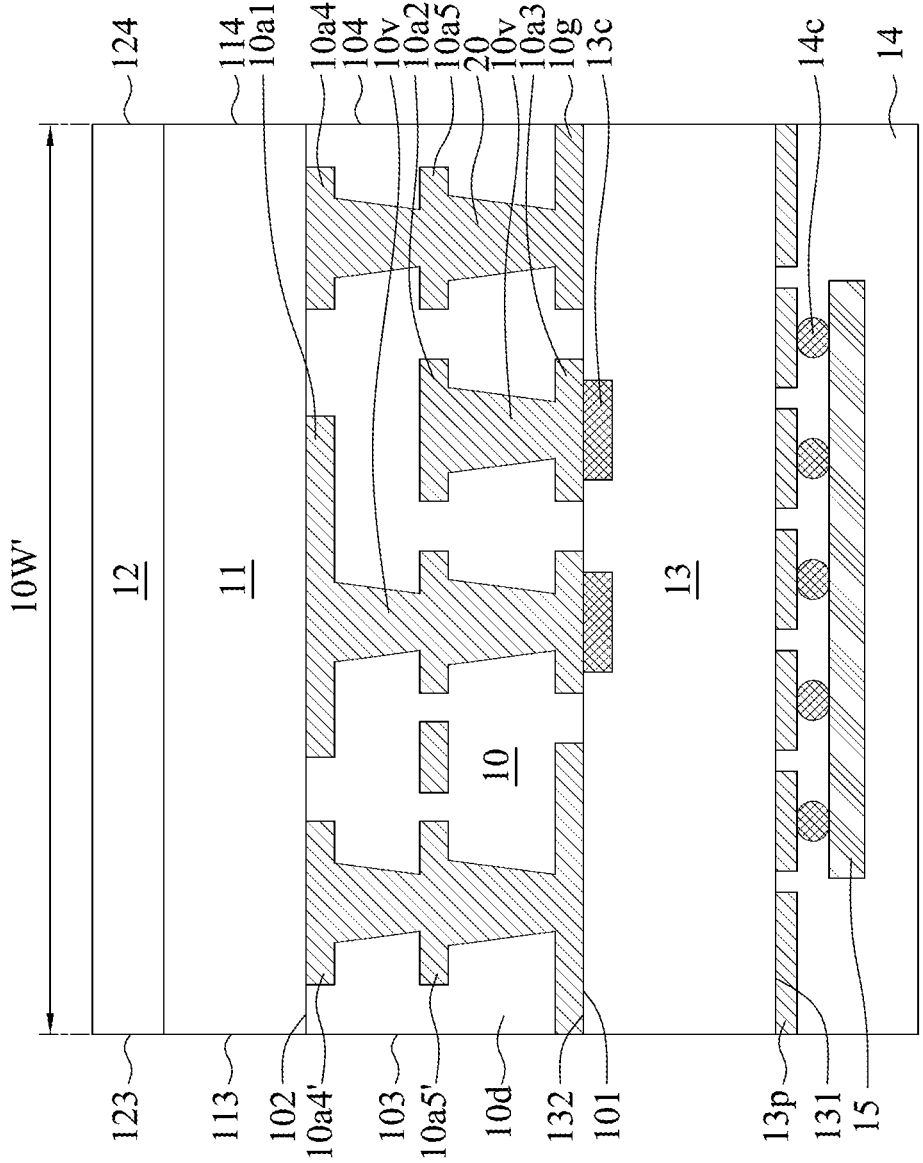
FIG. 2A is a cross-sectional view of an electronic device, in accordance with an embodiment of the present disclosure.

FIG. 2A is a cross-sectional view of an electronic device 2a, in accordance with an embodiment of the present disclosure. The electronic device 2a is similar to the electronic device 1a in FIG. 1A, and the differences therebetween are described below.

The electronic device 2a may further include parasitic antennas 10a4, 10a5, 10a4', 10a5', and a grounding element 20. The grounding element 20 may include a grounding via partially transmitting the dielectric layers 10d. The grounding element 20 may electrically contact or couple to antennas (such as the grounding pattern or the grounding portion 10g) of the radiating structure 10. The grounding element 20 may provide a grounding path or another electrical return path. The grounding element 20 may prevent ingress of environmental noise that may disrupt broadband communications.

The parasitic antennas 10a4, 10a5, 10a4', 10a5' may include patch antennas. The parasitic antennas 10a4, 10a5, 10a4', 10a5' may couple with the central antennas or antenna elements (such as the antenna layers 10a1, 10a2, and 10a3). For example, the parasitic antennas 10a4, 10a5, 10a4', 10a5' may contribute constructively in radiating EM fields and allow energy to be coupled between the parasitic antennas and the central antennas. In some arrangements, the parasitic antennas 10a4, 10a5, 10a4', 10a5' may increase the effective area of the central antennas. In some arrangements, the parasitic antennas 10a4, 10a5, 10a4', 10a5' may increase the impedance matching and bandwidth of the EM waves radiated by the radiating structure 10.

Figure 2B:
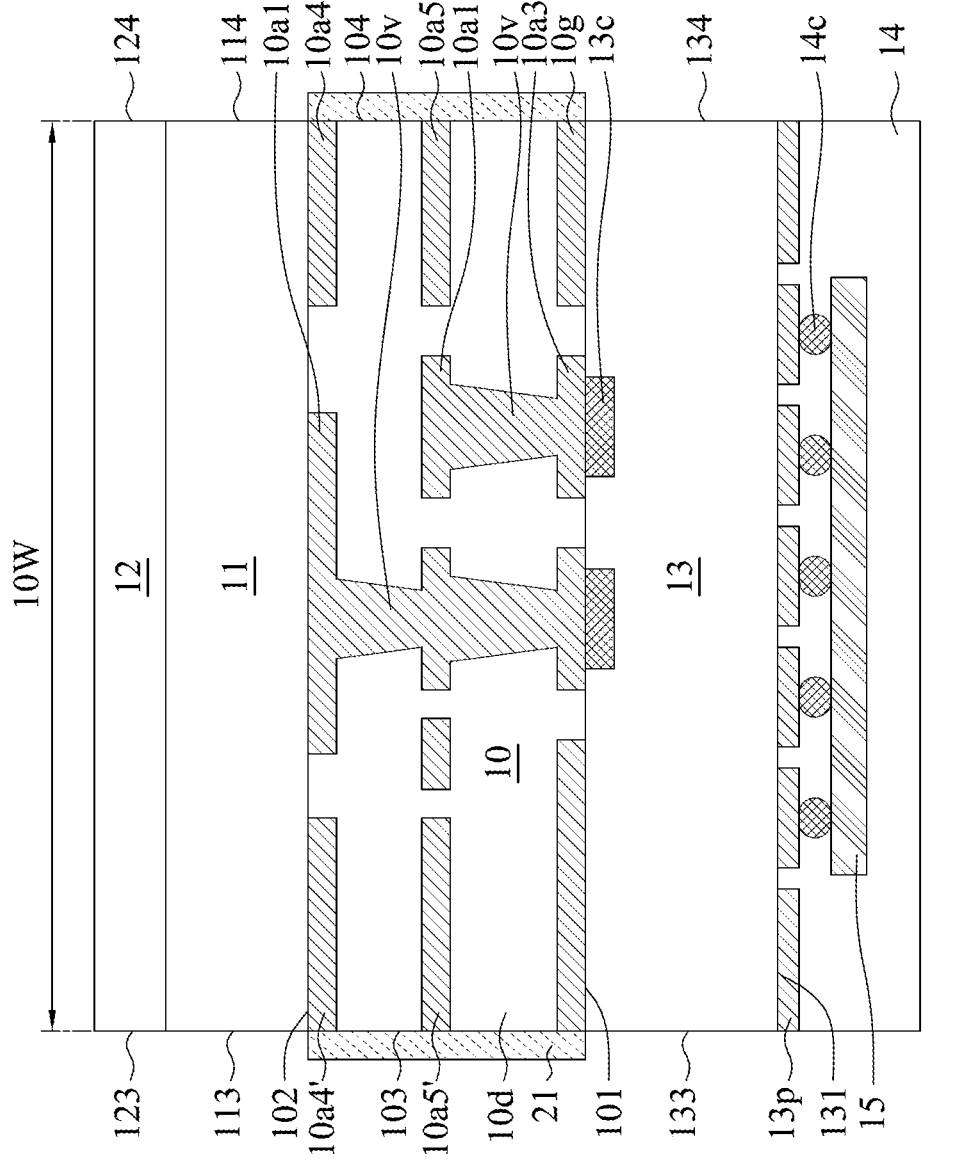
FIG. 2B is a cross-sectional view of an electronic device, in accordance with an embodiment of the present disclosure.

FIG. 2B is a cross-sectional view of an electronic device 2b, in accordance with an embodiment of the present disclosure. The electronic device 2b is similar to the electronic device 2a in FIG. 2A, and the differences therebetween are described below.

The parasitic antenna 10a4 may be electrically coupled to the antenna layer 10a1 and extend toward the lateral surface 104. The parasitic antenna 10a5 may be electrically coupled to the antenna layer 10a2 and extend toward the lateral surface 104.

The electronic device 2b may further include a grounding element 21. The grounding element 21 may include a conductive thin film disposed over or on the lateral surfaces 103 and 104 of the radiating structure 10. the parasitic antennas 10a4, 10a5, 10a4', 10a5', and the grounding portions 10g) may be exposed on the lateral surfaces 103 and 104 for grounding purposes. For example, the grounding element 21 may be configured for connecting the grounding portions 10g to the ground potential.

In some arrangements, the grounding element 21 may include copper (Cu) or other conductive materials, such as aluminum (Al), chromium (Cr), tin (Sn), gold (Au), silver (Ag), nickel (Ni) or stainless steel, another metal or a mixture, an alloy, or other combinations of two or more thereof. In some arrangements, the grounding element 21 may be or include a multi-layered structure. For example, layers of the grounding element 21 from the inside to the outside may include a seed layer (such as porous stainless steel, SUS), a conductive layer (such as Cu), and a protection layer (such as SUS).

In some arrangements, a grounding path established by the grounding element 20 in FIG. 2A requires a grounding pattern inside the radiating structure 10 to contact or couple to the grounding element 20, which will increase the width thereof (i.e., an increased width 10W) and the complexity of the grounding circuit.

According to some arrangements of the present disclosure, by using the grounding element 21 to replace the grounding element 20 in FIG. 2A, the width 10W can be reduced in comparison with the width 10W' and the manufacturing process can be simplified.

The grounding path established by the grounding element 21 is outside of the radiating structure 10. The grounding signal between the parasitic antennas 10a4, 10a5, 10a4', 10a5', and the grounding portions 10g may be transmitted without passing through the radiating structure 10.

Figure 2C:
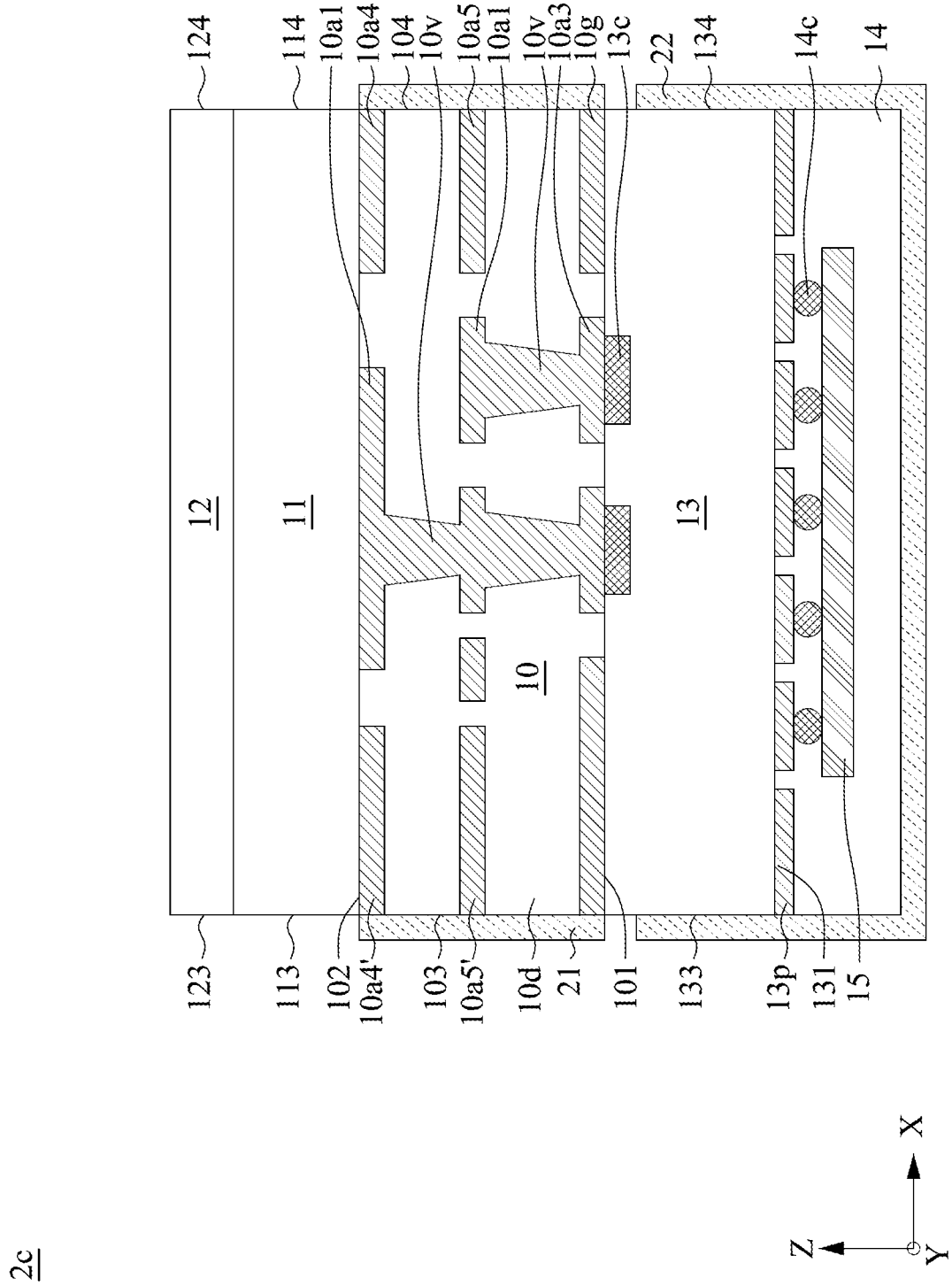
FIG. 2C is a cross-sectional view of an electronic device, in accordance with an embodiment of the present disclosure.
Figure 2C:
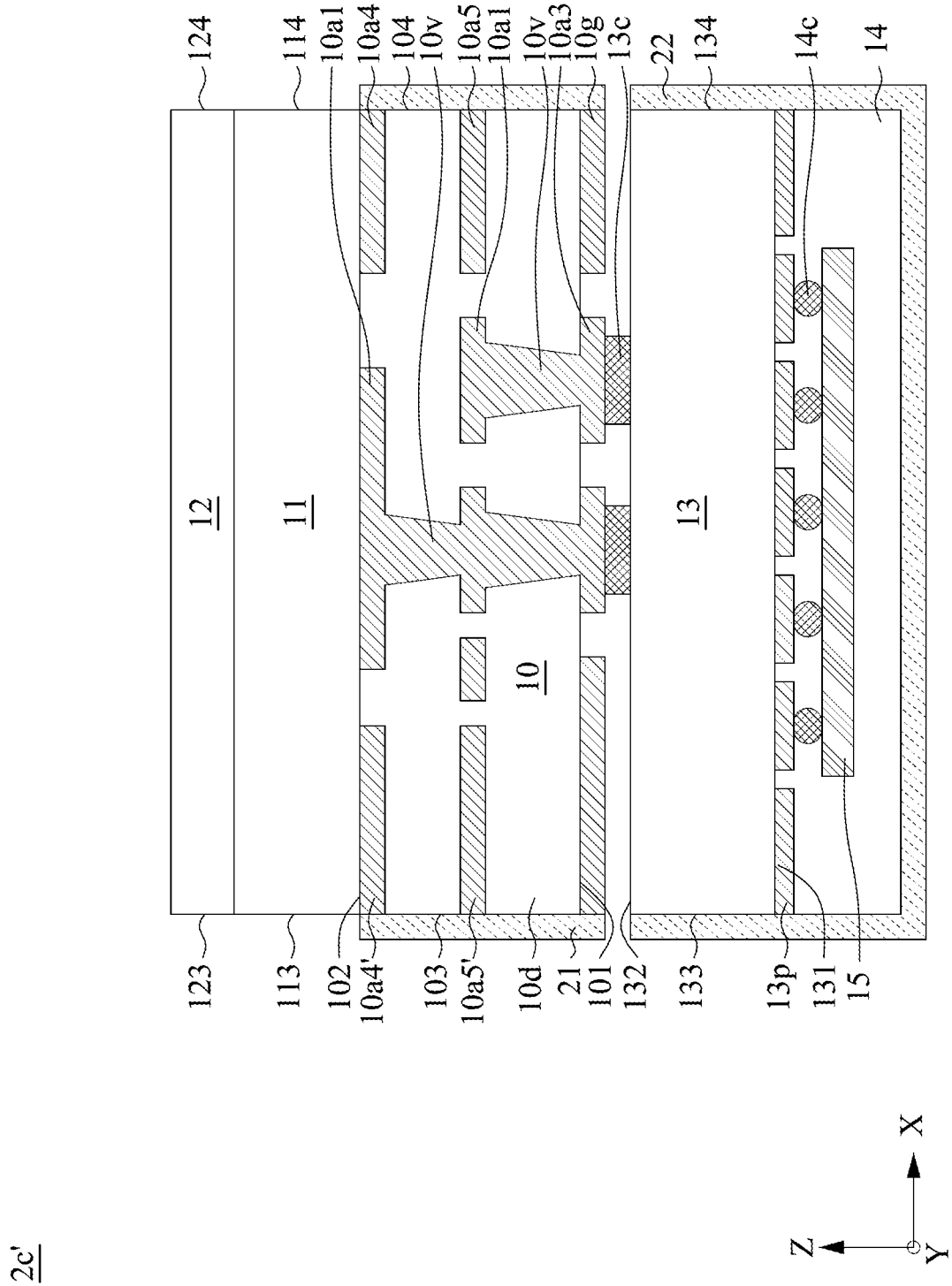

FIG. 2C is a cross-sectional view of an electronic device 2c, in accordance with an embodiment of the present disclosure. The electronic device 2c is similar to the electronic device 2b in FIG. 2B, and the differences therebetween are described below.

The electronic device 2c may further include a grounding element 22. The grounding element 22 may include a conductive thin film disposed over or on the outer surfaces (such as a lateral surface 133) of the circuit structure 13 and the encapsulant 14. The grounding element 22 and the grounding element 21 are physically separated from each other.

The grounding element 22 may be configured to provide an electromagnetic interference (EMI) shielding protection for the circuit structure 13. For example, the element 16 may be configured to alleviating EMI on the circuit structure 13. For example, the element 16 may be configured to provide an EMI shielding to prevent the electronic component 15 from being interfered with by other electronic components, and vice versa.

FIG. 2C' is a cross-sectional view of an electronic device 2c', in accordance with an embodiment of the present disclosure. The electronic device 2c' is similar to the electronic device 2c in FIG. 2C, and the differences therebetween are described below.

The radiating structure 10 may be spaced apart from the circuit structure 13 by a gap, such as an air gap. The antenna layer 10a3 may be exposed on the surface 101 of the radiating structure 10. The conductive elements 13c may be disposed over or on the surface 132 of the circuit structure 13 and electrically connect to the antenna layer 10a3. In some arrangements, the connections between the radiating structure 10 and the circuit structure 13 may be similar to the enlarged views in FIGS. 3B, 3C, and 3D.

Figure 2D:
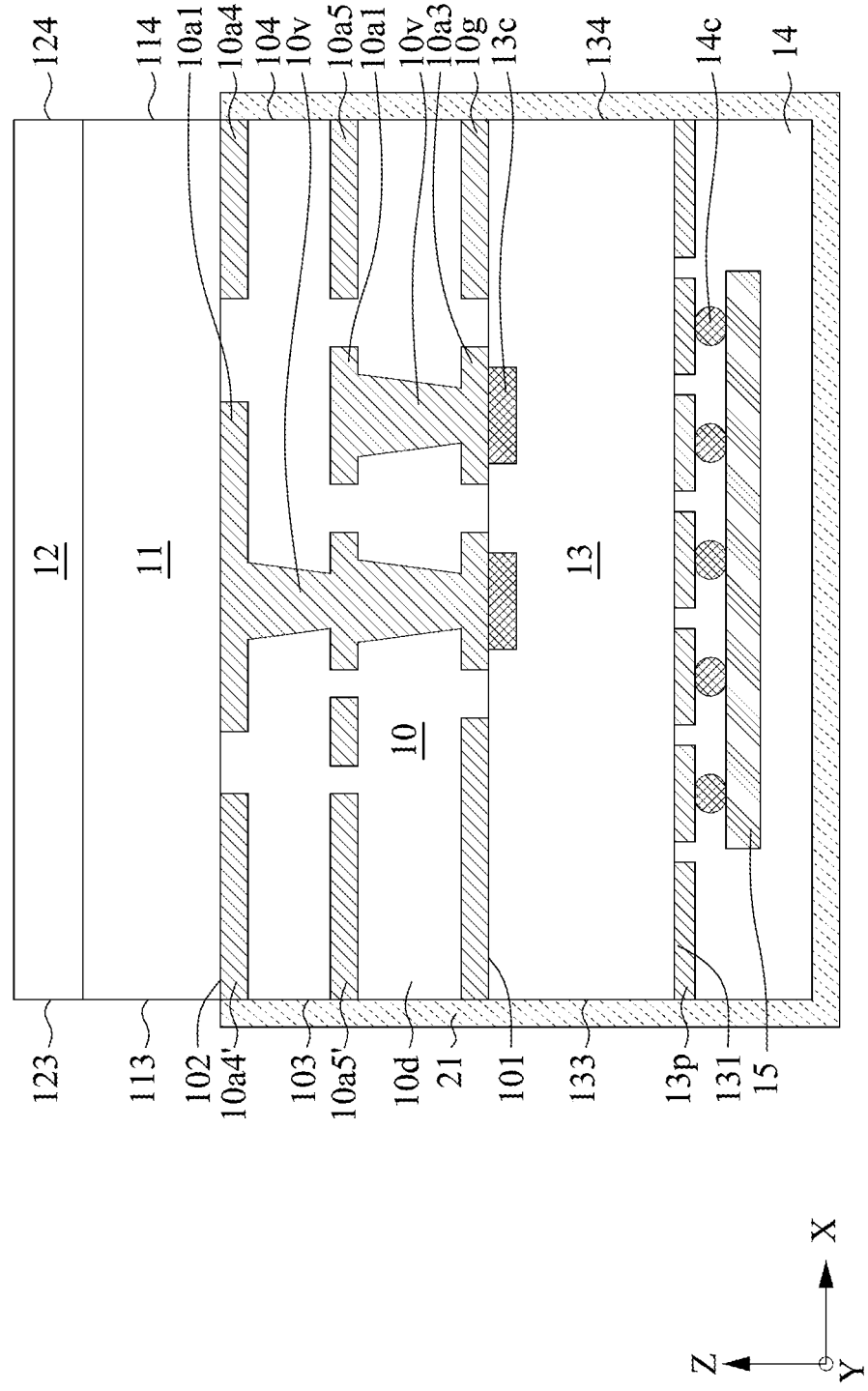
FIG. 2D is a cross-sectional view of an electronic device, in accordance with an embodiment of the present disclosure.

FIG. 2D is a cross-sectional view of an electronic device 2d, in accordance with an embodiment of the present disclosure. The electronic device 2d is similar to the electronic device 2b in FIG. 2B, and the differences therebetween are described below.

The grounding element 21 may be further disposed over or on the outer surfaces of the circuit structure 13 and the encapsulant 14. For example, the grounding element 21 may continuously extend between the lateral surfaces 103 and 104 of the radiating structure 10 and the sidewalls (such as the lateral surface 133) of the circuit structure 13. The lateral surfaces 113 and 114 of the transceiving element 11 may be uncovered or exposed by the grounding element 21.

Figure 2E:
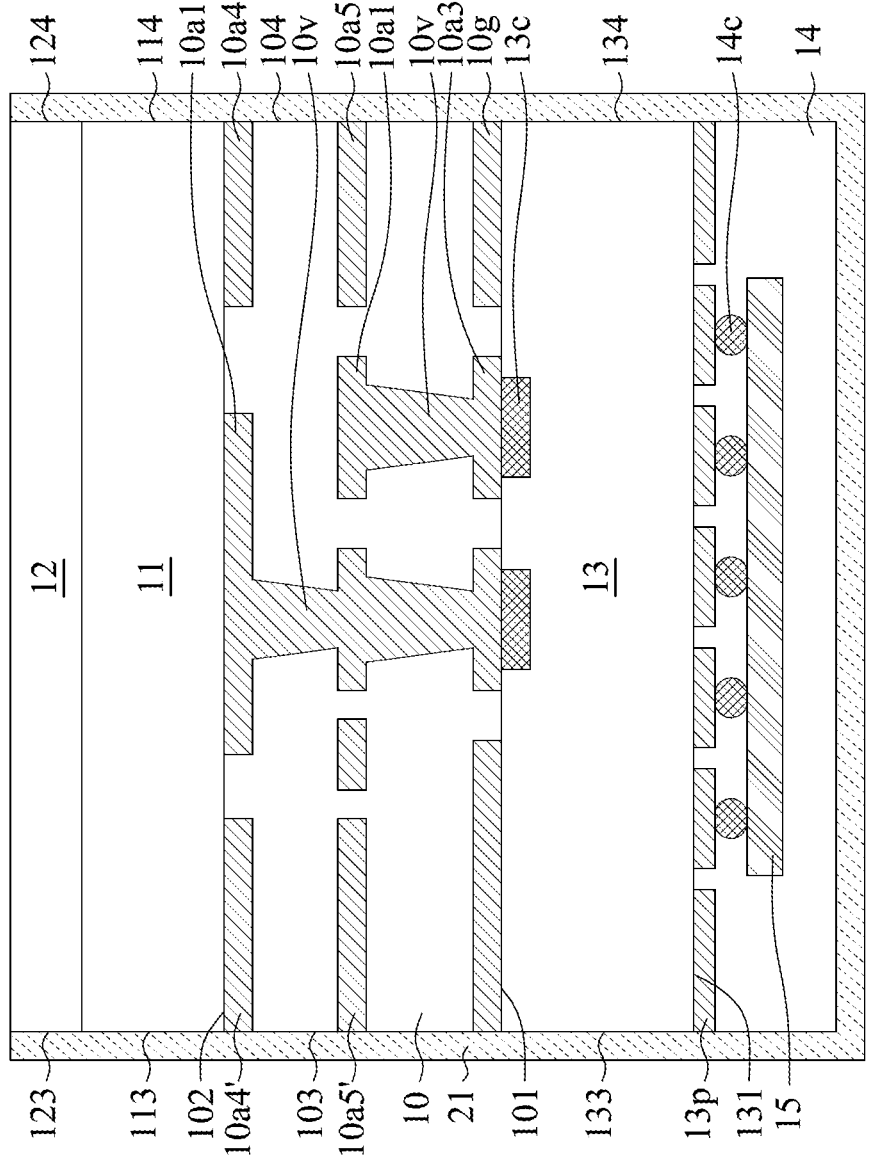
FIG. 2E is a cross-sectional view of an electronic device, in accordance with an embodiment of the present disclosure.

FIG. 2E is a cross-sectional view of an electronic device 2e, in accordance with an embodiment of the present disclosure. The electronic device 2e is similar to the electronic device 2b in FIG. 2B, and the differences therebetween are described below.

The grounding element 21 may be further disposed over or on the lateral surfaces 113 and 114 of the transceiving element 11. The grounding element 21 may be further disposed over or on the lateral surfaces 123 and 124 of the transceiving element 12. For example, the grounding element 21 may continuously extend between the lateral surfaces 103 and 104 of the radiating structure 10 and the lateral surfaces 113 and 114 of the transceiving element 11.

Figure 2F:
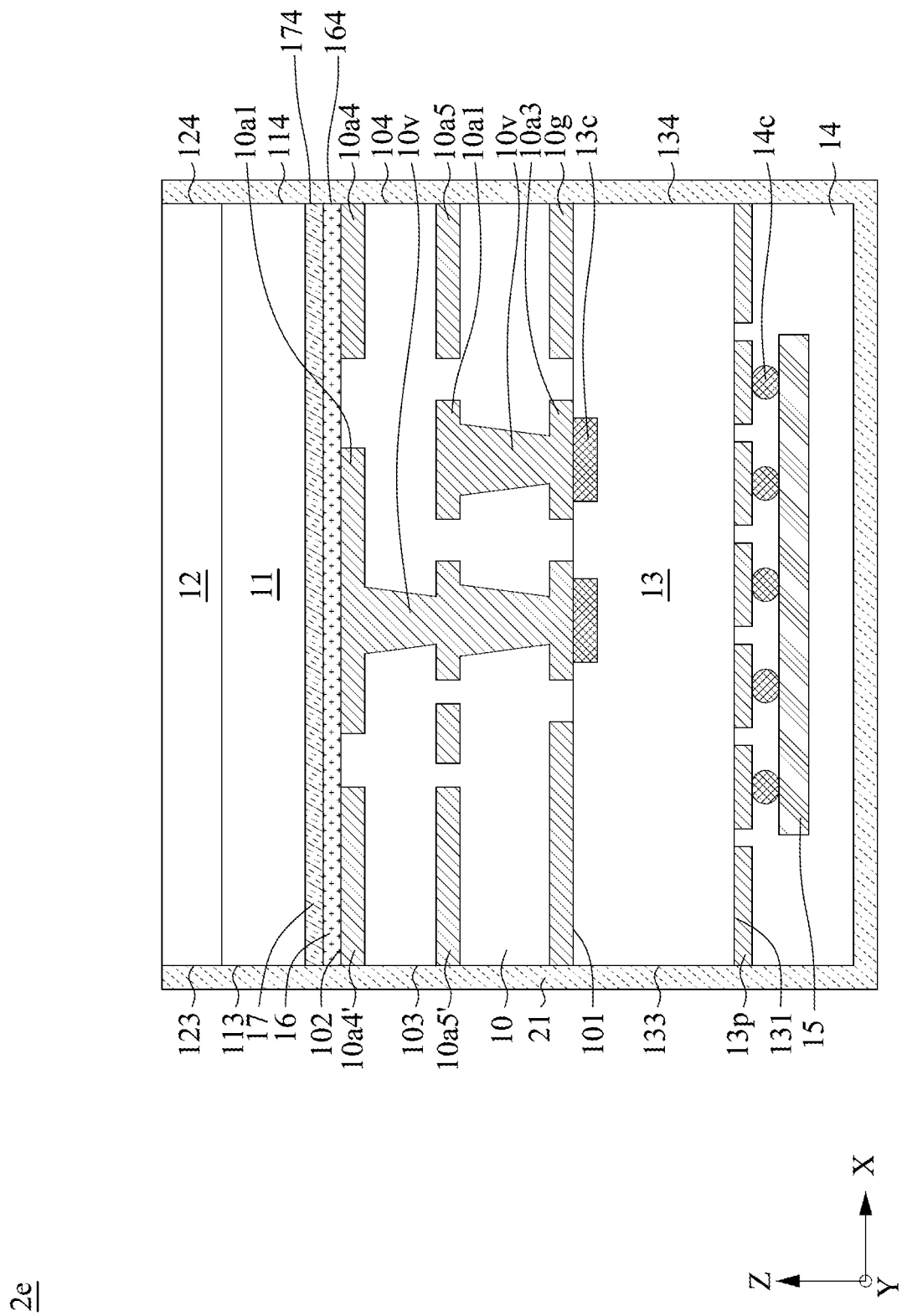
FIG. 2F is a cross-sectional view of an electronic device, in accordance with an embodiment of the present disclosure.

FIG. 2F is a cross-sectional view of an electronic device 2e, in accordance with an embodiment of the present disclosure. The electronic device 2f is similar to the electronic device 2e in FIG. 2E, and the differences therebetween are described below.

In some arrangements, the transceiving element 11 may be connected to the radiating structure 10 through the layer 16 and layer 17. The grounding element 21 may be disposed over or on the lateral surfaces 164 and 174 of the layer 16 and layer 17.

In some arrangements, the transceiving element 11 may be connected to the radiating structure 10 through the layer 16 as shown in FIG. 1B. The grounding element 21 may be disposed over or on the lateral surfaces 164 of the layer 16.

Figure 2G:
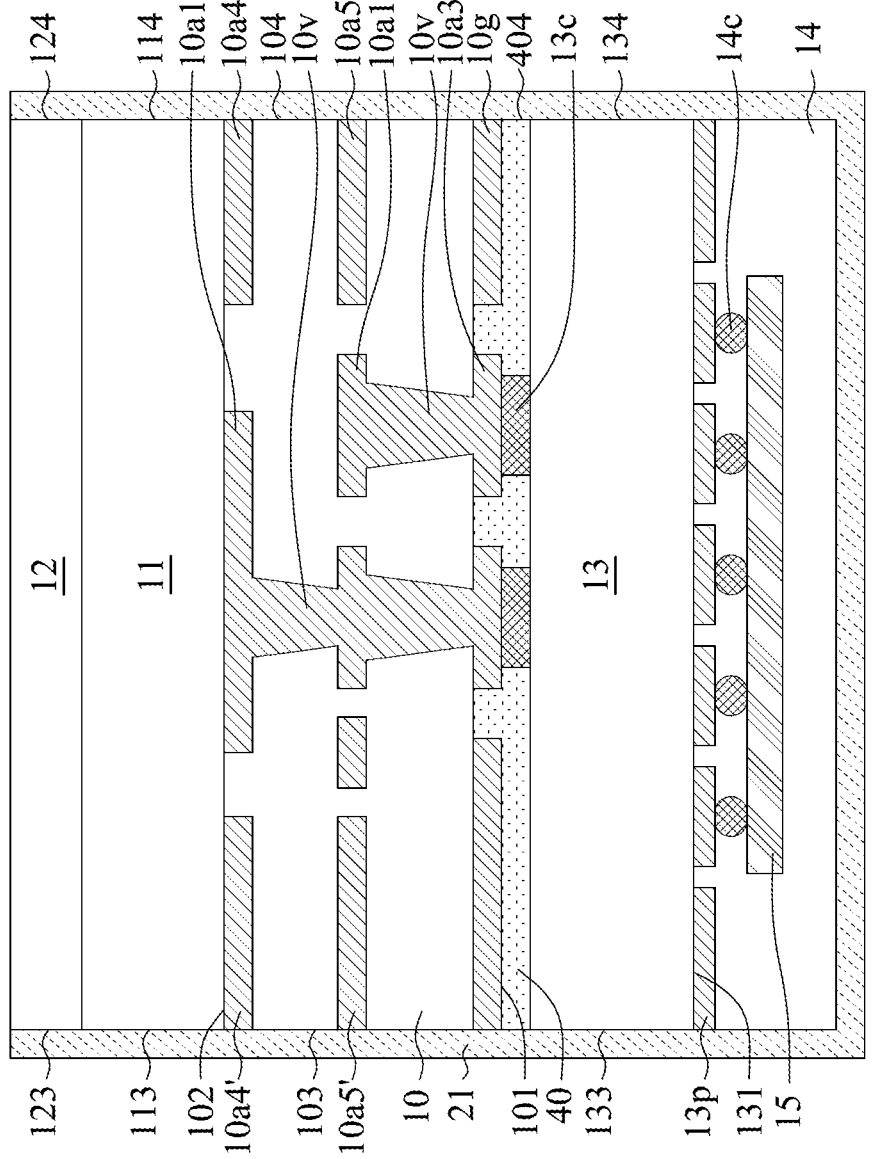
FIG. 2G is a cross-sectional view of an electronic device, in accordance with an embodiment of the present disclosure.

FIG. 2G is a cross-sectional view of an electronic device 2e, in accordance with an embodiment of the present disclosure. The electronic device 2g is similar to the electronic device 2e in FIG. 2E, and the differences therebetween are described below.

In some arrangements, the radiating structure 10 may be connected to the circuit structure 13 through a bonding layer (such as the layer 40 in FIG. 4A, further described below). The grounding element 21 may be disposed over or on the lateral surfaces 404 of the bonding layer 40. In some arrangements, the connections between the radiating structure 10 and the circuit structure 13 may be similar to the enlarged views in FIGS. 4B and 4C.

Figure 3A:
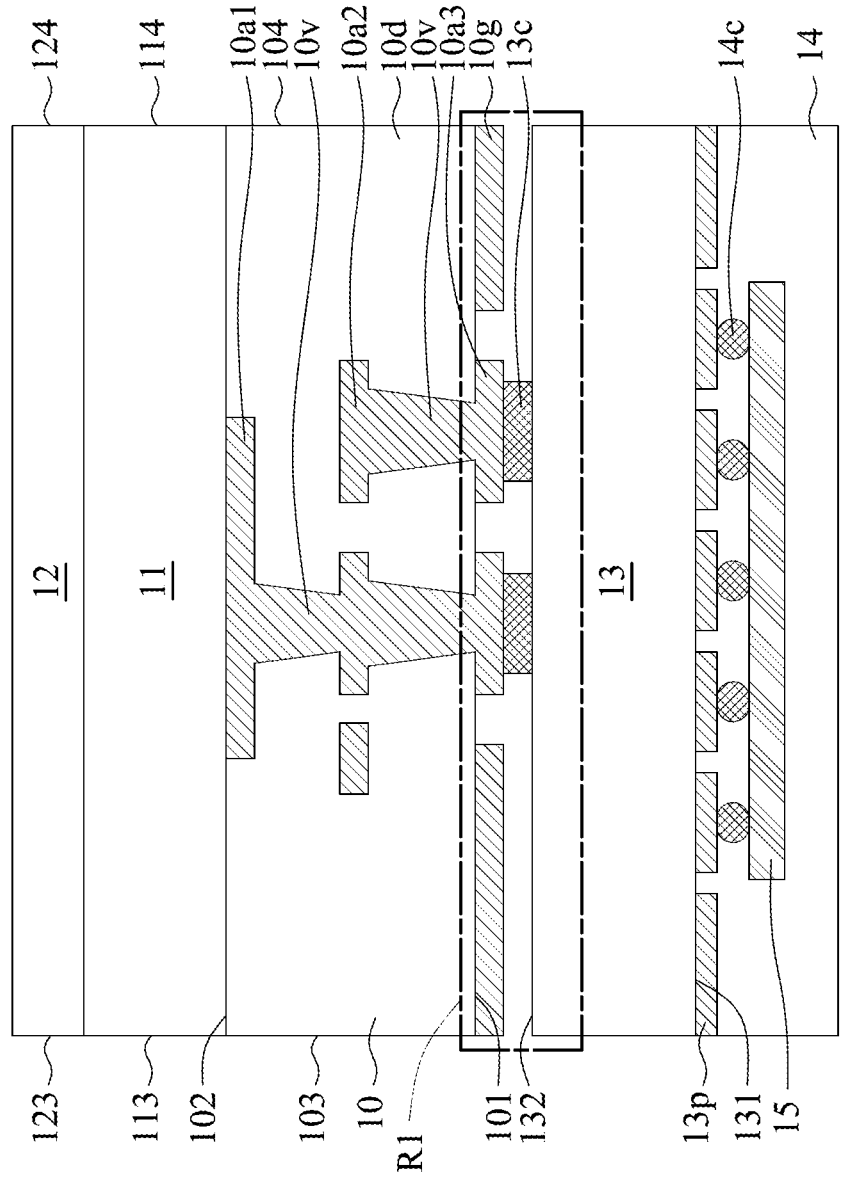
FIG. 3A is a cross-sectional view of an electronic device, in accordance with an embodiment of the present disclosure.
Figure 3B:
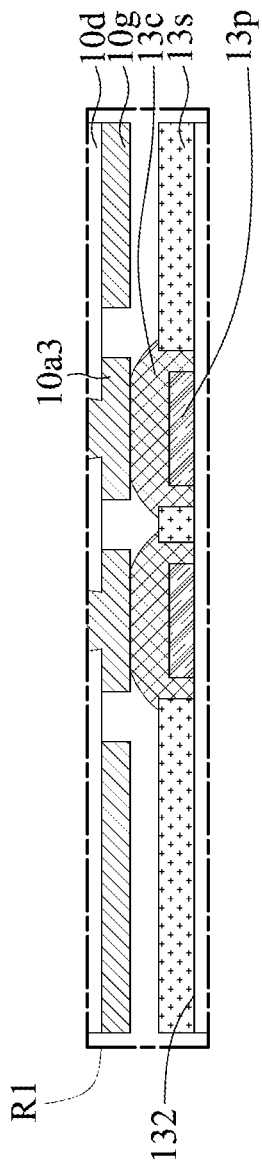
FIG. 3B is an enlarged view of region R1 shown in FIG. 3A, in accordance with an embodiment of the present disclosure.

FIG. 3A is a cross-sectional view of an electronic device 3a, in accordance with an embodiment of the present disclosure. The electronic device 3a is similar to the electronic device 1a in FIG. 1A, and the differences therebetween are described below.

The radiating structure 10 may be spaced apart from the circuit structure 13 by a gap, such as an air gap. The antenna layer 10a3 may be exposed on the surface 101 of the radiating structure 10. The conductive elements 13c may be disposed over or on the surface 132 of the circuit structure 13 and electrically connect to the antenna layer 10a3.

In some arrangements, the radiating structure 10 and the circuit structure 13 may be manufactured separately, and then integrated by the conductive elements 13c, which can thereby simplify the manufacturing process.

Figure 3C:
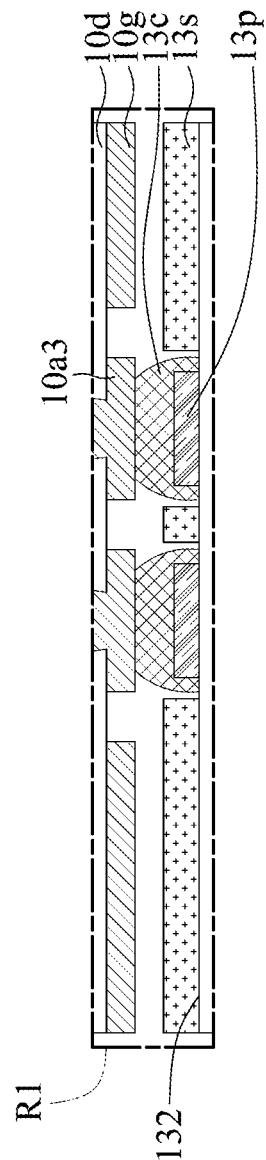
FIG. 3C is an enlarged view of region R1 shown in FIG. 3A, in accordance with an embodiment of the present disclosure.
Figure 3D:
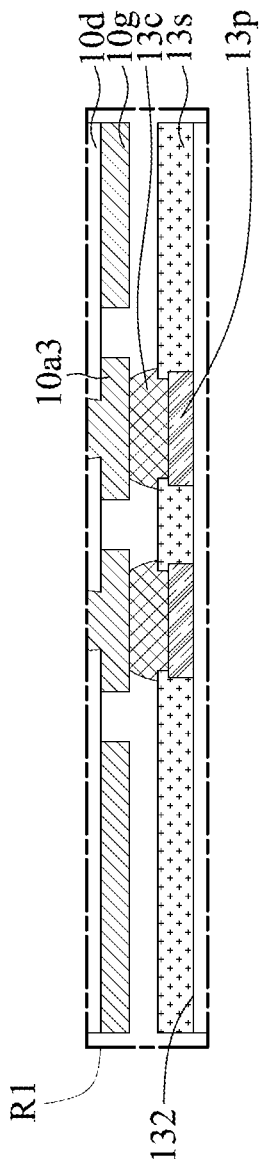
FIG. 3D is an enlarged view of region R1 shown in FIG. 3A, in accordance with an embodiment of the present disclosure.

FIGS. 3B, 3C, and 3D are enlarged views of region R1 shown in FIG. 3A, in accordance with an embodiment of the present disclosure.

Referring to FIG. 3B, the circuit structure 13 may include the conductive pads 13p and passivation layer 13s on the surface 132. The conductive pads 13p may be spaced apart from the passivation layer 13s. The conductive elements 13c may be disposed over or on the surface 132 and electrically connected with the conductive pads 13p on the surface 132.

The conductive elements 13c may fill the gap (not annotated in the figures) between the conductive pads 13p and the passivation layer 13s.

Referring to FIG. 3C, it is similar to FIG. 3B except that the conductive elements 13c are spaced apart from the passivation layer 13s.

Referring to FIG. 3D, it is similar to FIG. 3B except that the conductive pads 13p are at least partially covered by the passivation layer 13s.

Figure 4A:
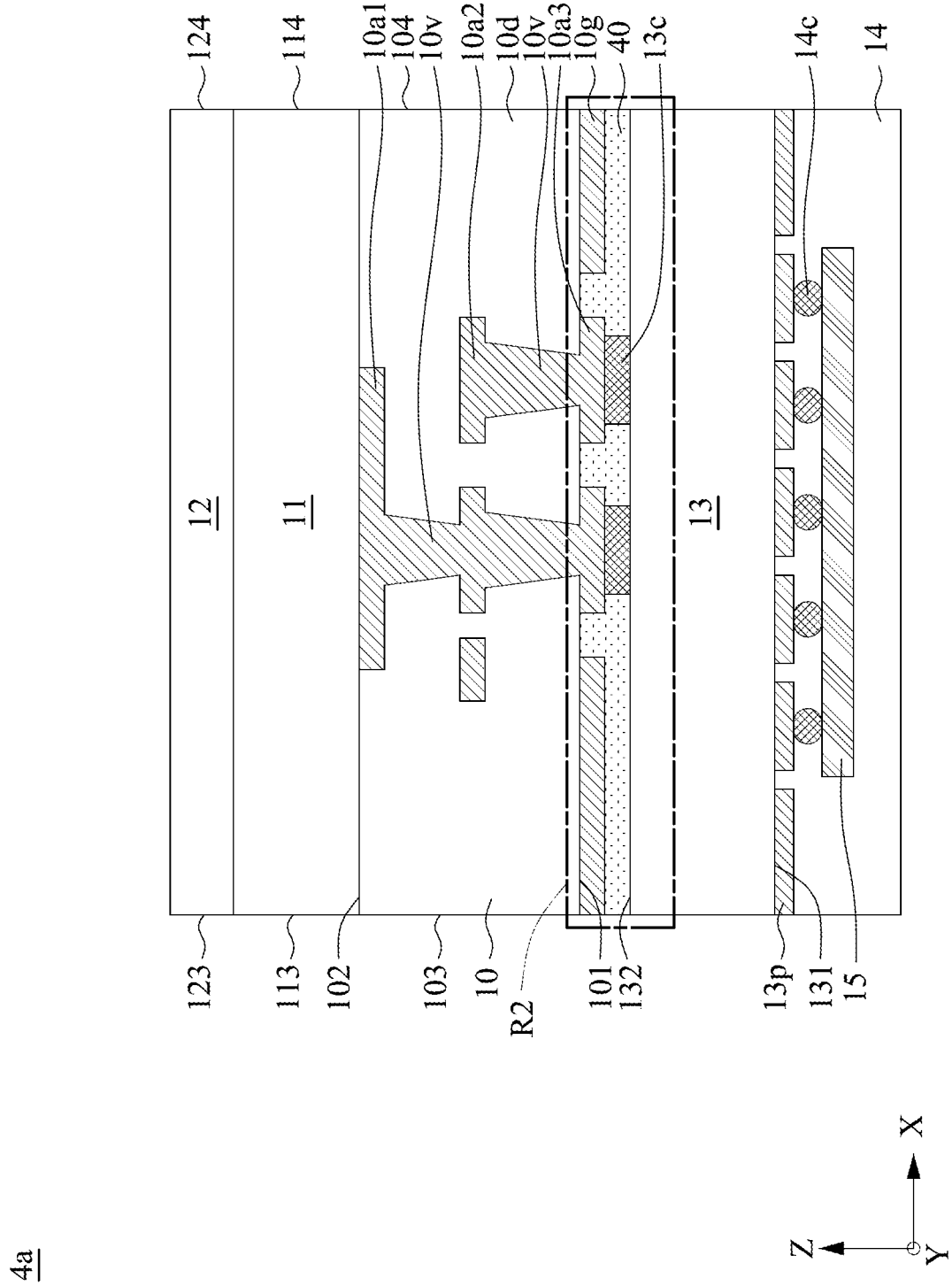
FIG. 4A is a cross-sectional view of an electronic device, in accordance with an embodiment of the present disclosure.

FIG. 4A is a cross-sectional view of an electronic device 4a, in accordance with an embodiment of the present disclosure. The electronic device 4a is similar to the electronic device 3a in FIG. 3A, and the differences therebetween are described below.

The electronic device 4a may further include a layer 40. The layer 40 may be disposed adjacent to the surface 101 of the radiating structure 10. The layer 40 may be disposed over or on the surface 101 of the radiating structure 10. The layer 40 may contact (such as directly contact) the antennas of the antenna layer 10a3 of the radiating structure 10. The layer 40 may physically separate the radiating structure 10 from the circuit structure 13.

In some arrangements, the layer 40 may include a protective layer or a bonding layer. In some arrangements, the layer 40 may include a solder resist layer, an adhesive, a glue, an underfill, or other suitable materials.

FIGS. 4B and 4C are enlarged views of region R2 shown in FIG. 4A, in accordance with an embodiment of the present disclosure.

Referring to FIG. 4B, the conductive elements 13c may be covered by the layer 40. The layer 40 may fill the gap (not annotated in the figures) between the conductive pads 13p and the passivation layer 13s. The conductive elements 13c may penetrate the layer 40 to contact the conductive pads 13p. The conductive elements 13c may be replaced by a conductive via.

Referring to FIG. 4C, it is similar to FIG. 4B except that the conductive pads 13p are at least partially covered by the passivation layer 13s.

Figure 4D:
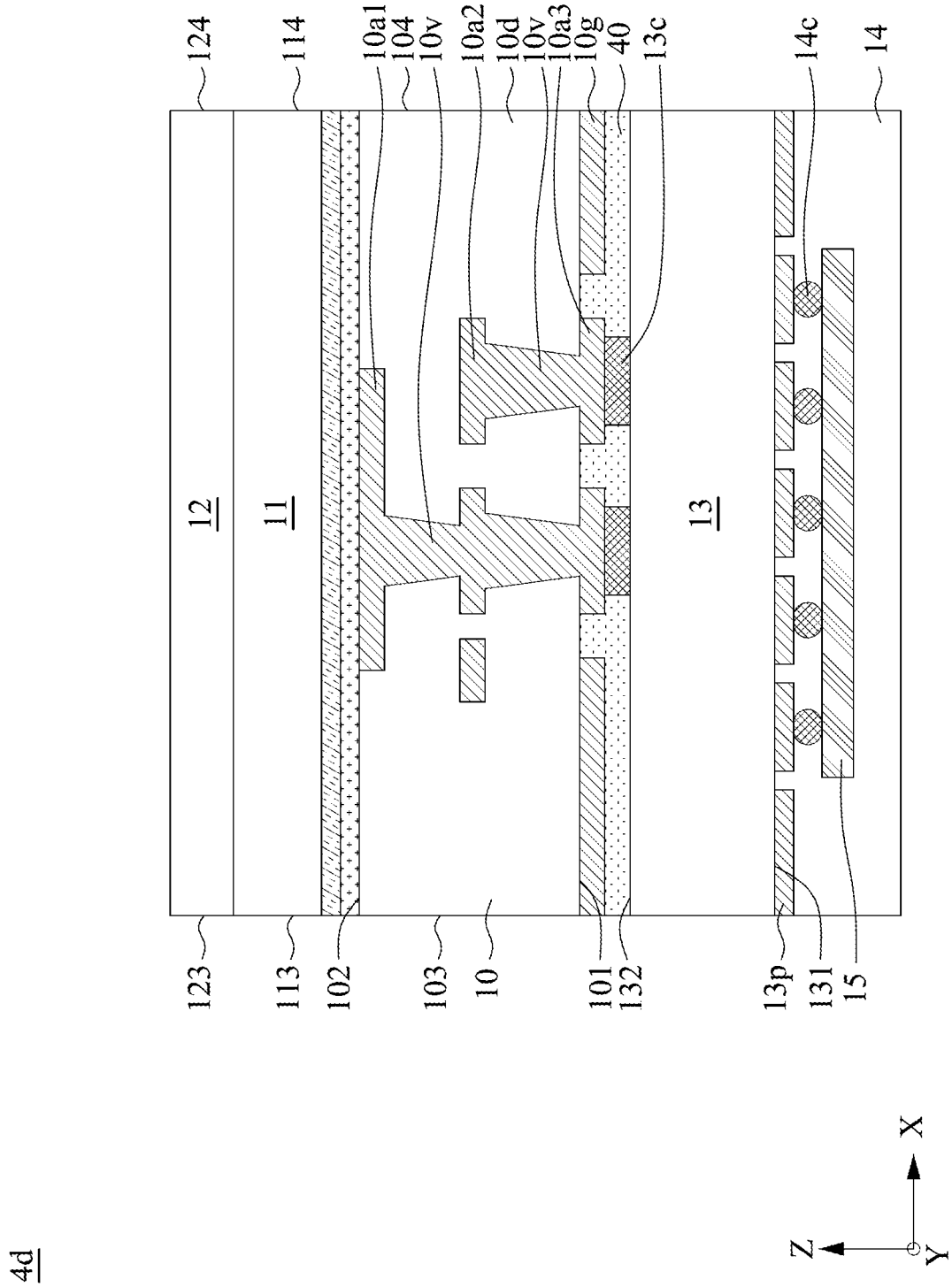
FIG. 4D is a cross-sectional view of an electronic device, in accordance with an embodiment of the present disclosure.

FIG. 4D is a cross-sectional view of an electronic device 4d, in accordance with an embodiment of the present disclosure. The electronic device 4d is similar to the electronic device 4a in FIG. 4A except that the electronic device 4d may further include the layer 16 and the layer 17.

Figure 5A:
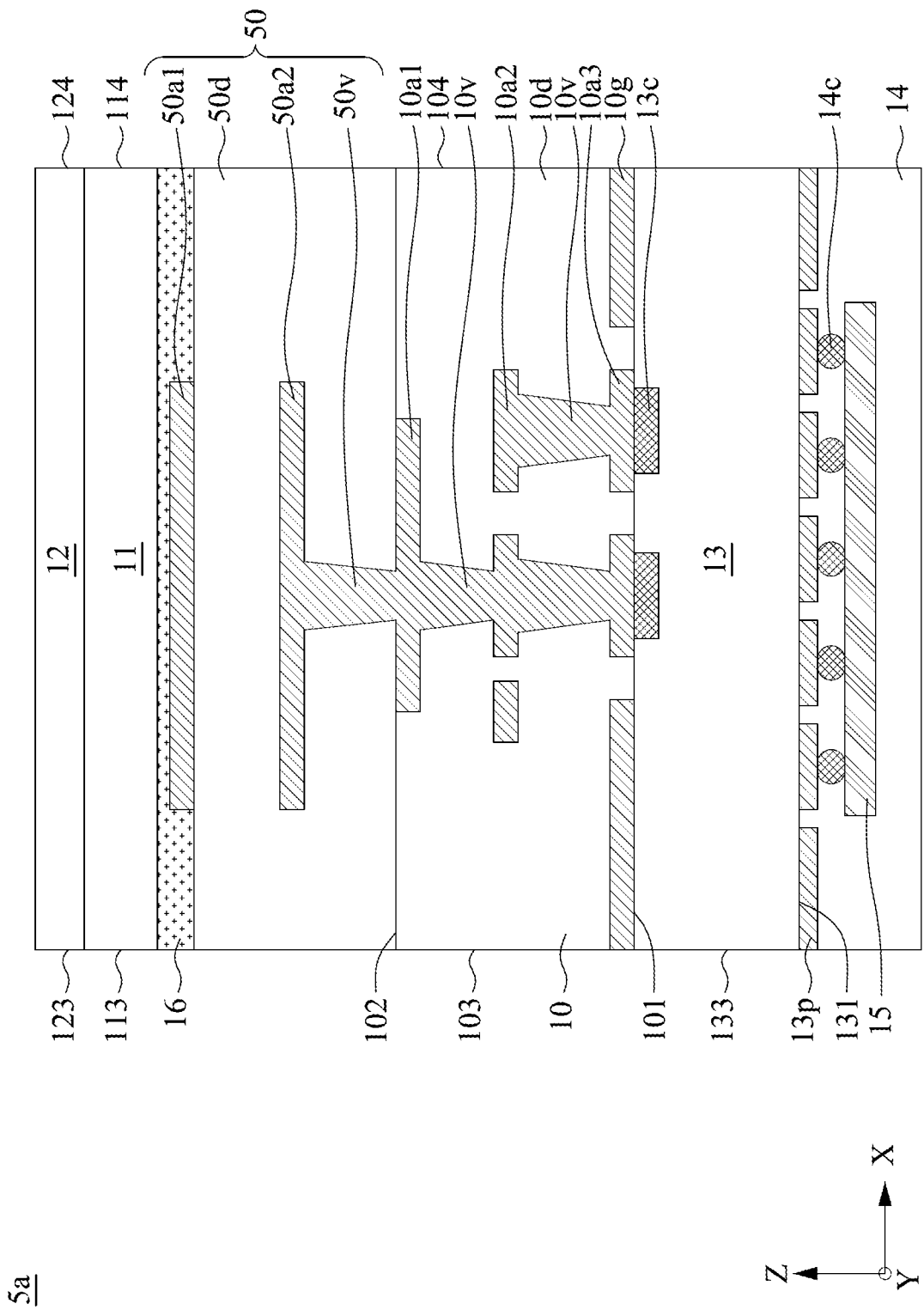
FIG. 5A is a cross-sectional view of an electronic device, in accordance with an embodiment of the present disclosure.

FIG. 5A is a cross-sectional view of an electronic device 5a, in accordance with an embodiment of the present disclosure. The electronic device 5a is similar to the electronic device 1a in FIG. 1A, and the differences therebetween are described below.

The electronic device 5a may further include a radiating structure 50. The radiating structure 50 may be disposed between the radiating structure 10 and the transceiving element 11. The radiating structure 50 may be similar to the radiating structure 10, and the details are the same as those of the previous paragraphs described with respect to the radiating structure 10.

The radiating structure 50 may include antenna layers 50a1 and 50a2, one or more dielectric layers 50d, and one or more conductive vias 50v. The radiating structure 50 may couple to the radiating structure 10 through the conductive vias 50v.

In some arrangements, the radiating structure 50 may include a multilayer stack. For example, the antenna layers 50a1 and 50a2 may include patches located at different horizontal levels and spaced apart by a predetermined distance. The patches may be coupled to each other. For example, the antenna layer 50a2 may be located at a lower horizontal level and closer to the radiating structure 10 than the antenna layer 50a1. In some arrangements, the antenna layer 50a2 may be fully within the dielectric layers 50d and the antenna layer 50a1 may be partially within or outside the dielectric layers 50d. The antenna layer 50a1 may be partially exposed from the dielectric layers 50d and covered by the layer 16.

The number of antenna layers of the radiating structure 50 is not limited thereto. In some arrangements, there may be any number of antenna layers depending on design requirements.

Figure 5B:
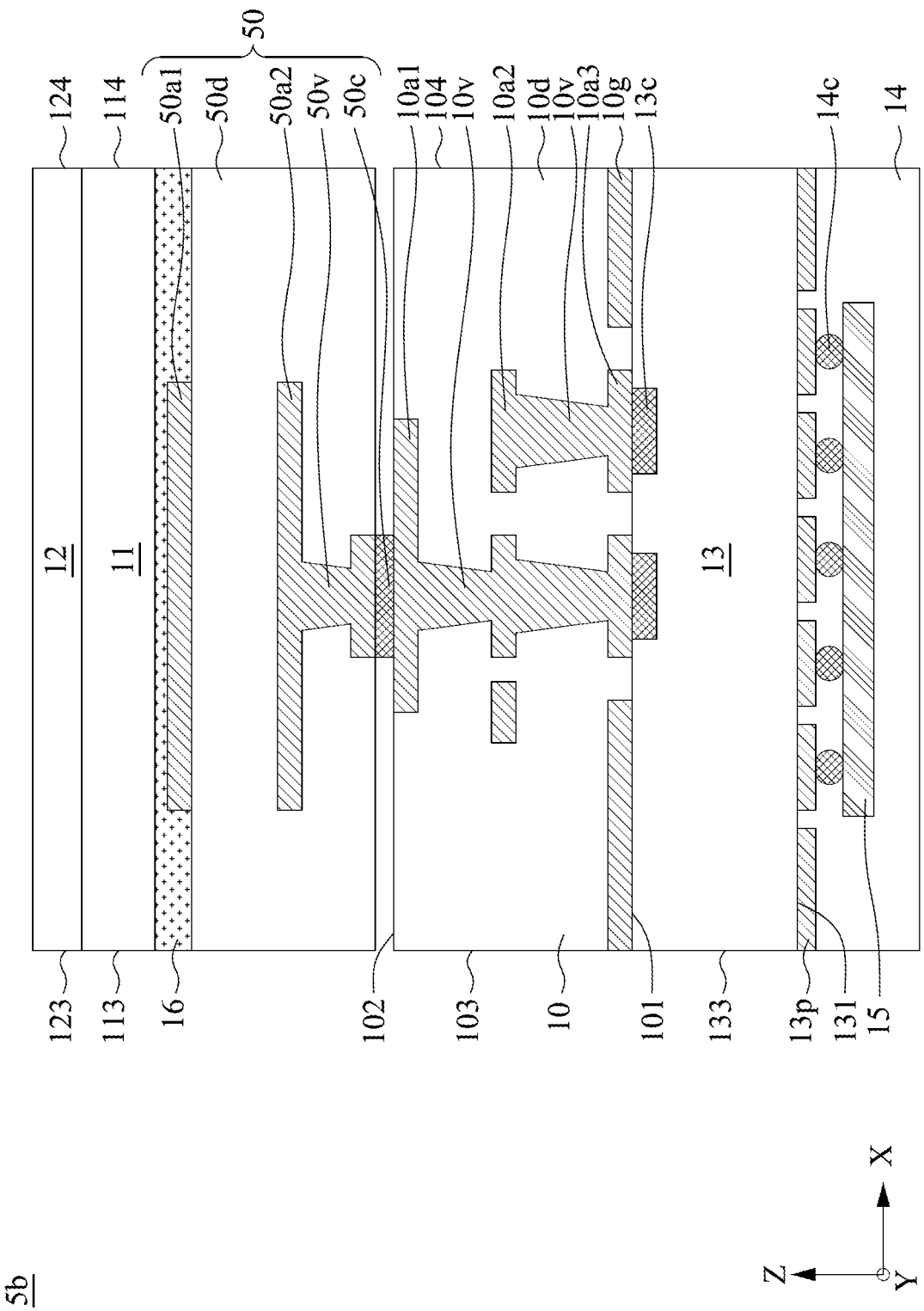
FIG. 5B is a cross-sectional view of an electronic device, in accordance with an embodiment of the present disclosure.

FIG. 5B is a cross-sectional view of an electronic device 5b, in accordance with an embodiment of the present disclosure. The electronic device 5b is similar to the electronic device 5a in FIG. 5A, and the differences therebetween are described below.

The radiating structure 10 may be spaced apart from the radiating structure 50 by a gap, such as an air gap. The antenna layer 10a1 may be exposed on the surface 102 of the radiating structure 10. Conductive elements 50c may be disposed over or on the surface 102 of the radiating structure 10 and electrically connect to the antenna layer 10a1.

In some arrangements, the radiating structure 10 and the radiating structure 50 may be manufactured separately, and then integrated by the conductive elements 50c, which can thereby simplify the manufacturing process.

Figure 5C:
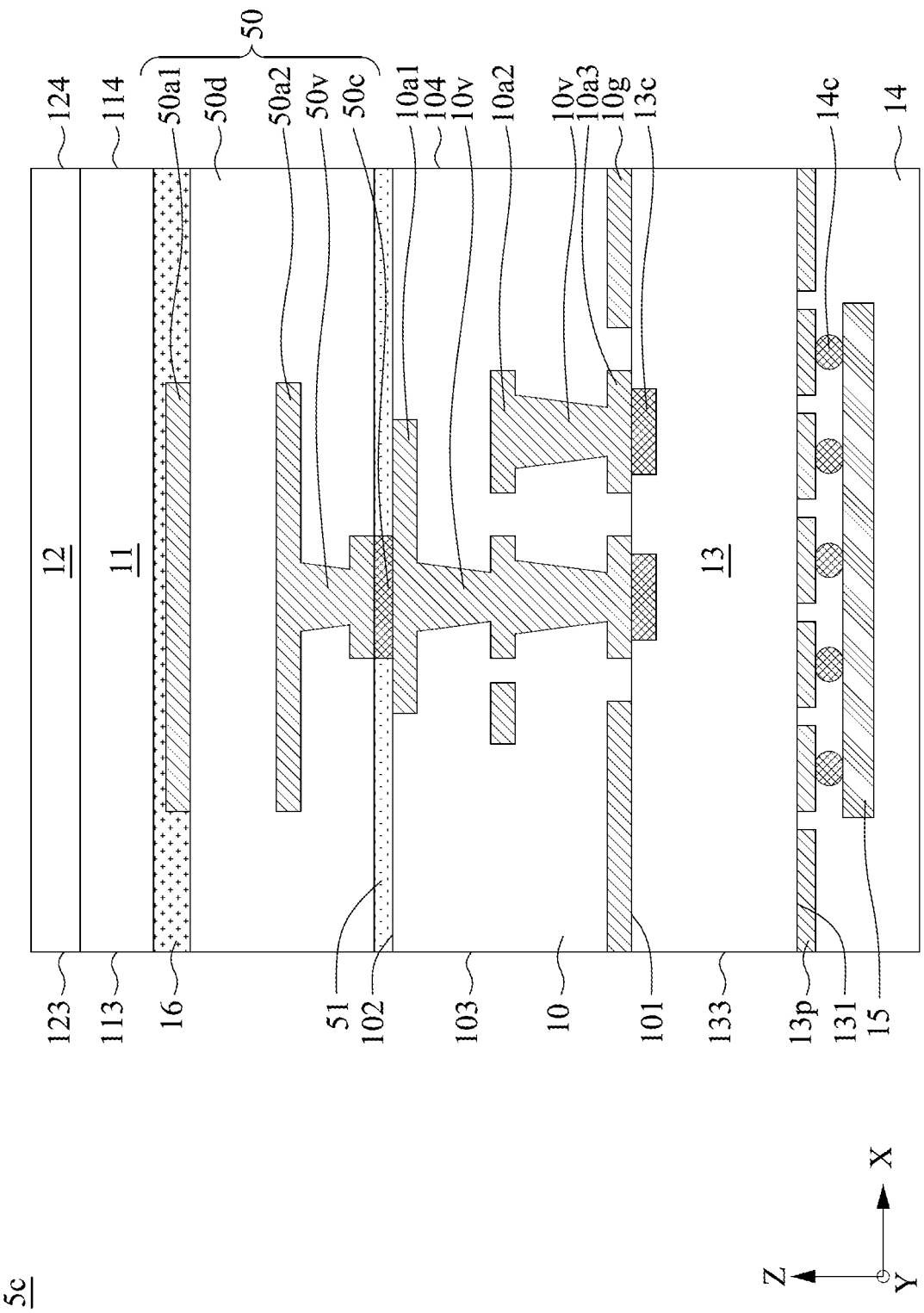
FIG. 5C is a cross-sectional view of an electronic device, in accordance with an embodiment of the present disclosure.

FIG. 5C is a cross-sectional view of an electronic device 5c, in accordance with an embodiment of the present disclosure. The electronic device 5c is similar to the electronic device 5b in FIG. 5B, and the differences therebetween are described below.

The electronic device 5c may further include a layer 51. The layer 51 may be disposed adjacent to the surface 102 of the radiating structure 10. The layer 51 may be disposed over or on the surface 102 of the radiating structure 10. The layer 51 may contact (such as directly contact) the antennas of the antenna layer 10a1 of the radiating structure 10. The layer 51 may physically separate the radiating structure 10 from the radiating structure 50.

In some arrangements, the layer 51 may include a protective layer or a bonding layer. In some arrangements, the layer 51 may include a solder resist layer, an adhesive, a glue, an underfill, or other suitable materials.

Figure 6:
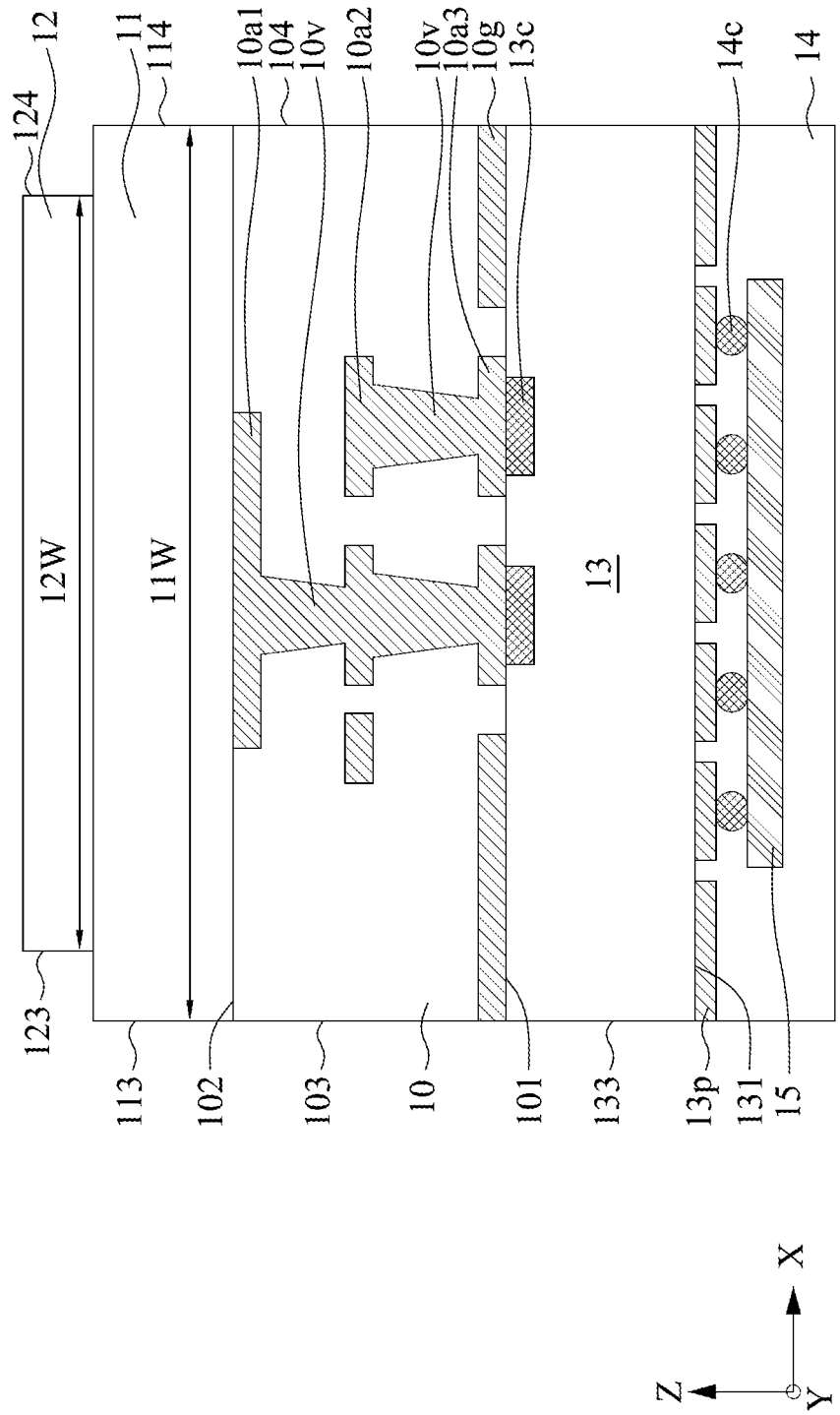
FIG. 6 is a cross-sectional view of an electronic device, in accordance with an embodiment of the present disclosure.

FIG. 6 is a cross-sectional view of an electronic device 6, in accordance with an embodiment of the present disclosure. The electronic device 6 is similar to the electronic device 1a in FIG. 1A, and the differences therebetween are described below.

The width 12W of the transceiving element 12 may be smaller than the width 10W of the radiating structure 10 to match the factors (e.g., resonant frequency, impedance, admittance (the reciprocal of impedance), phase, wavelength, etc.) of the EM waves having relatively higher frequencies.

In some arrangements, at least the radiating area (or the total surface area) of the relatively higher-band antennas of the radiating structure 10 may be fully, entirely, or completely covered by the transceiving element 12. For example, the radiating area (or the total surface area) of the relatively lower-band antennas of the radiating structure 10 may be partially non-overlapped with (or uncovered by) the transceiving element 12.

In some arrangements, EM waves having relatively higher frequencies may completely transmit through the transceiving elements 11 and 12. In some arrangements, EM waves having relatively lower frequencies may completely transmit through the transceiving element 11 but be partially free from transmitting through the transceiving element 12.

For example, though it is still possible for the transceiving element 12 to provide propagation to the EM waves having relatively lower frequencies, the coverage range is more limited when compared with the embodiment of FIG. 1A. However, the transmission for the EM waves having relatively higher frequencies can be improved.

Figure 7:
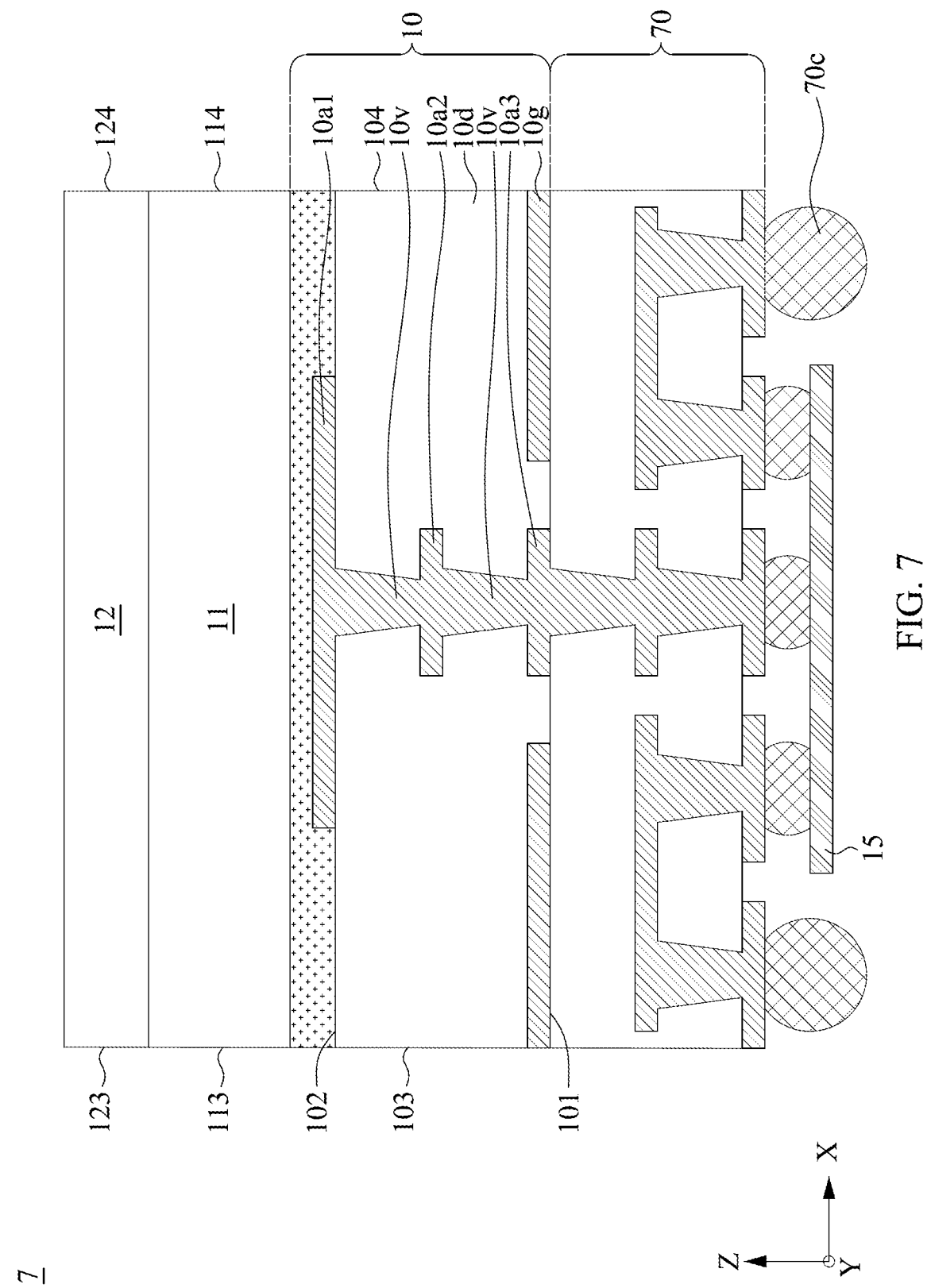
FIG. 7 is a cross-sectional view of an electronic device, in accordance with an embodiment of the present disclosure.

FIG. 7 is a cross-sectional view of an electronic device 7, in accordance with an embodiment of the present disclosure. The electronic device 7 is similar to the electronic device 1a in FIG. 1A, and the differences therebetween are described below.

The electronic device 7 includes a fan-out structure or a fan-out substrate 70. In some arrangements, the fan-out substrate 70 includes one or more redistribution layers (RDLs) or interposer-like wirings. In some arrangements, the line width (e.g., the width of a line), the line spacing (e.g., the distance or the pitch between two adjacent lines), and/or the pad pitch (e.g., the distance or pitch between two adjacent pads) in the fan-out substrate 70 may be less than those of the circuit structure 13. Therefore, the transmission for the EM waves having relatively higher frequencies can be improved.

In some arrangements, one or more conductive elements (or electrical contacts) 70c may be disposed over or on the fan-out substrate 70 to provide electrical connections between the electronic device 7 and external components (e.g., external circuits or circuit boards). In some arrangements, the conductive elements 70c may include a controlled collapse chip connection (C4) bump, a ball grid array (BGA) or a land grid array (LGA).

Spatial descriptions, such as "above," "below," "up," "left," "right," "down," "top," "bottom," "vertical" "horizontal" "side," "higher," "lower," "upper," "over," "under," and so forth are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of arrangements of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific arrangements thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other arrangements of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. An electronic device, comprising:
   a first transceiving element;
   a second transceiving element disposed over the first transceiving element; and
   a radiating structure including a first antenna configured to radiate a first electromagnetic (EM) wave having a lower frequency, and a second antenna configured to radiate a second EM wave having a higher frequency;
   wherein the second antenna is disposed between the first antenna and the first transceiving element, and
   wherein the first transceiving element and the second transceiving element are collectively configured to provide a higher gain or bandwidth for the first EM wave than for the second EM wave.

2. The electronic device of claim 1, wherein the first transceiving element is configured to provide a higher gain or bandwidth for the first EM wave than for the second EM wave.

3. The electronic device of claim 1, wherein the second transceiving element is configured to provide a higher gain or bandwidth for the second EM wave than for the first EM wave.

4. The electronic device of claim 1, wherein the first EM wave entirely transmits through the first transceiving element.

5. The electronic device of claim 1, wherein a part of the first EM wave is free from transmitting through the second transceiving element.

6. An electronic device, comprising:
   a radiating structure configured to operate at a first frequency and a second frequency different from the first frequency;
   a first transceiving element disposed over the radiating structure and having a first dielectric constant (Dk); and
   a second transceiving element disposed over the first transceiving element and having a second Dk different from the first Dk,
   wherein a lateral surface of first transceiving element is substantially aligned with a lateral surface of the radiating structure.

7. The electronic device of claim 6, wherein the first transceiving element is configured to direct a first EM wave having the first frequency and the second transceiving element is configured to direct a second EM wave having the second frequency.

8. The electronic device of claim 7, wherein the second frequency is greater than the first frequency.

9. The electronic device of claim 6, wherein the radiating structure comprises a dielectric material and antenna elements at least partially embedded in the dielectric material, wherein the lateral surface of first transceiving element is substantially aligned with a lateral surface of the dielectric material.

10. The electronic device of claim 9, wherein the antenna elements comprises:
    a first antenna configured to radiate a first EM wave having the first frequency; and
    a second antenna overlapping with first antenna and configured to radiate a second EM wave having the second frequency.

11. The electronic device of claim 6, wherein the second Dk is greater than the first Dk.

12. The electronic device of claim 6, wherein a thickness of the first transceiving element is greater than a thickness of the second transceiving element.

13. The electronic device of claim 6, wherein a lateral surface of second transceiving element is substantially aligned with the lateral surface of the radiating structure.

14. An electronic device, comprising:
    an antenna structure including a lateral surface, a first conductive element, and a second conductive element, wherein the second conductive element is electrically coupled to the first conductive element and extends to the lateral surface of the antenna structure; and
    a third conductive element disposed at the lateral surface of the antenna structure and configured for connecting the second conductive element to a ground potential.

15. The electronic device of claim 14, further comprising:
    a circuit structure disposed under the antenna structure;
    wherein the third conductive element is disposed over a lateral surface of the circuit structure.

16. The electronic device of claim 15, wherein the antenna structure is connected to the circuit structure through a bonding layer and the third conductive element is disposed over a lateral surface of the bonding layer.

17. The electronic device of claim 14, further comprising:
a circuit structure disposed under the antenna structure; and fourth conductive element disposed over a lateral surface of the circuit structure, wherein the fourth conductive element is spaced apart from the third conductive element and configured to connect to the ground potential and alleviating electromagnetic interference (EMI) on the circuit structure.

18. The electronic device of claim 14, further comprising:
a dielectric element disposed over the antenna structure and configured to increase an antenna gain of the antenna structure;
wherein the third conductive element is disposed over a lateral surface of the dielectric element.

19. The electronic device of claim 18, wherein the dielectric element is connected to the antenna structure through an adhesive layer and the third conductive element is disposed over a lateral surface of the adhesive layer.

\* \* \* \* \*